United States Patent
Burgess et al.

(10) Patent No.: US 7,399,671 B2
(45) Date of Patent: Jul. 15, 2008

(54) DISPOSABLE PILLARS FOR CONTACT FORMATION

(75) Inventors: Byron Neville Burgess, Allen, TX (US); John K. Zahurak, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 288 days.

(21) Appl. No.: 11/217,980

(22) Filed: Sep. 1, 2005

(65) Prior Publication Data

US 2007/0049010 A1    Mar. 1, 2007

(51) Int. Cl.
*H01L 21/8242* (2006.01)

(52) U.S. Cl. ............... 438/253; 438/256; 438/279; 438/631; 438/633; 438/672

(58) Field of Classification Search .......... None
See application file for complete search history.

(56) References Cited

U.S. PATENT DOCUMENTS

| | | | |
|---|---|---|---|
| 5,030,587 A * | 7/1991 | Wald et al. .......... | 438/253 |
| 5,569,355 A | 10/1996 | Then | |
| 6,010,935 A | 1/2000 | Doan | |
| 6,010,953 A * | 1/2000 | Prall .......... | 438/586 |
| 6,048,763 A | 4/2000 | Doan et al. | |
| 6,531,727 B2 | 3/2003 | Ahn et al. | |
| 6,929,999 B2 * | 8/2005 | Park et al. .......... | 438/253 |
| 7,029,970 B2 * | 4/2006 | Ahn .......... | 438/239 |
| 2002/0130348 A1 * | 9/2002 | Tran .......... | 257/306 |
| 2003/0203569 A1 * | 10/2003 | Shin et al. .......... | 438/253 |
| 2004/0217407 A1 * | 11/2004 | Cho et al. .......... | 257/306 |
| 2004/0229428 A1 * | 11/2004 | Cho et al. .......... | 438/253 |
| 2005/0085072 A1 | 4/2005 | Kim et al. | |
| 2006/0134854 A1 * | 6/2006 | Park et al. .......... | 438/239 |

FOREIGN PATENT DOCUMENTS

| EP | 0 681 338 B1 | 10/1999 |
|---|---|---|
| EP | 1 061 592 A2 | 12/2000 |

* cited by examiner

*Primary Examiner*—David E Graybill
(74) *Attorney, Agent, or Firm*—Knobbe Martens Olson & Bear LLP

(57) ABSTRACT

Sacrificial plugs for forming contacts in integrated circuits, as well as methods of forming connections in integrated circuit arrays are disclosed. Various pattern transfer and etching steps can be used to create densely-packed features and the connections between features. A sacrificial material can be patterned in a continuous zig-zag line pattern that crosses word lines. Planarization can create parallelogram-shaped blocks of material that can overlie active areas to form sacrificial plugs, which can be replaced with conductive material to form contacts.

29 Claims, 14 Drawing Sheets

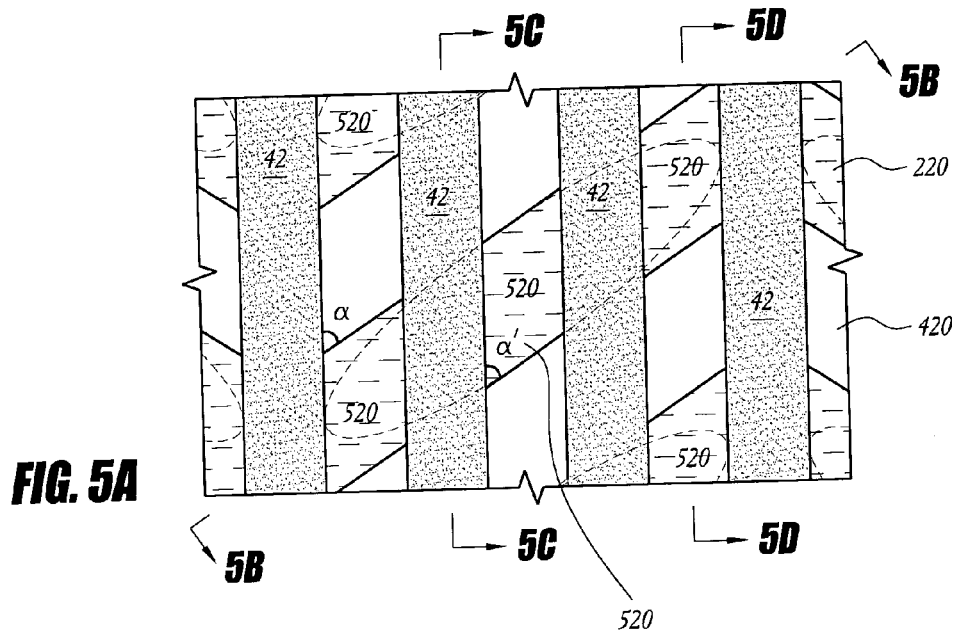
FIG. 5A
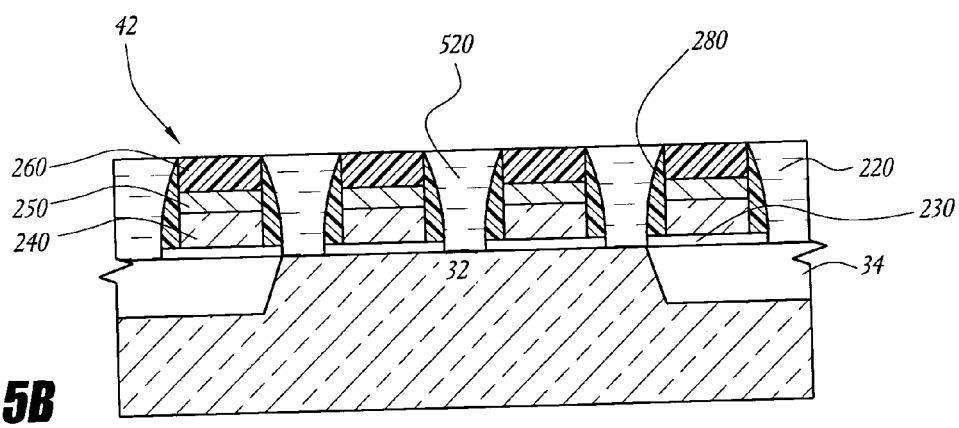
FIG. 5B
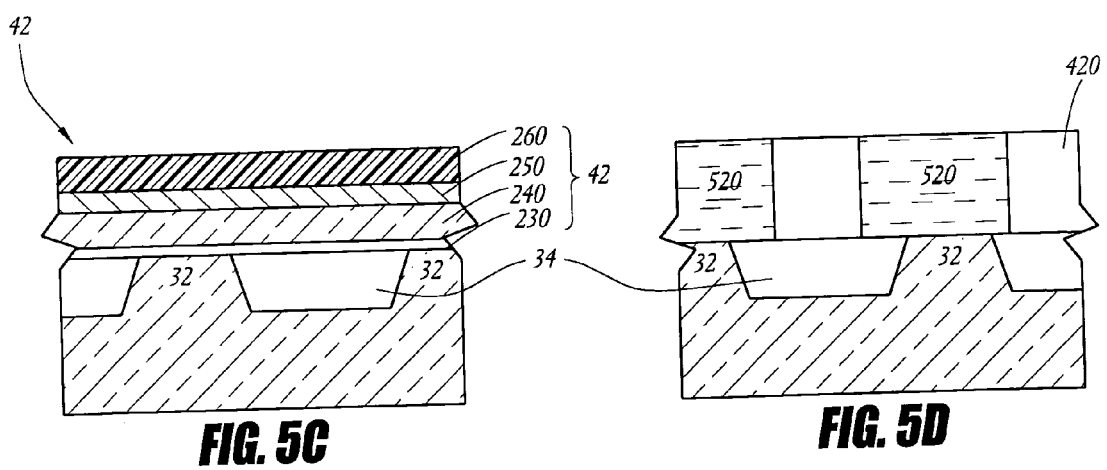
FIG. 5C
FIG. 5D

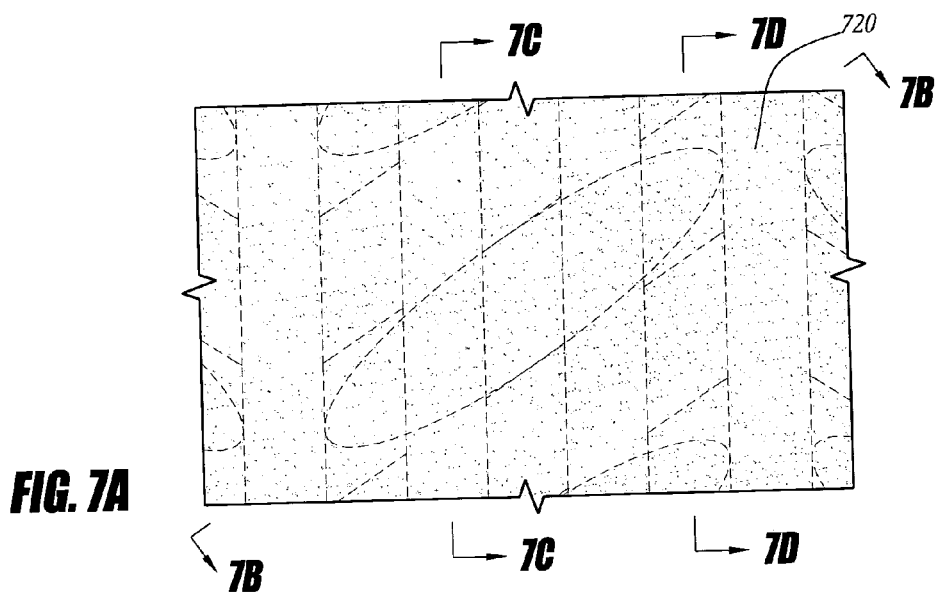
FIG. 7A
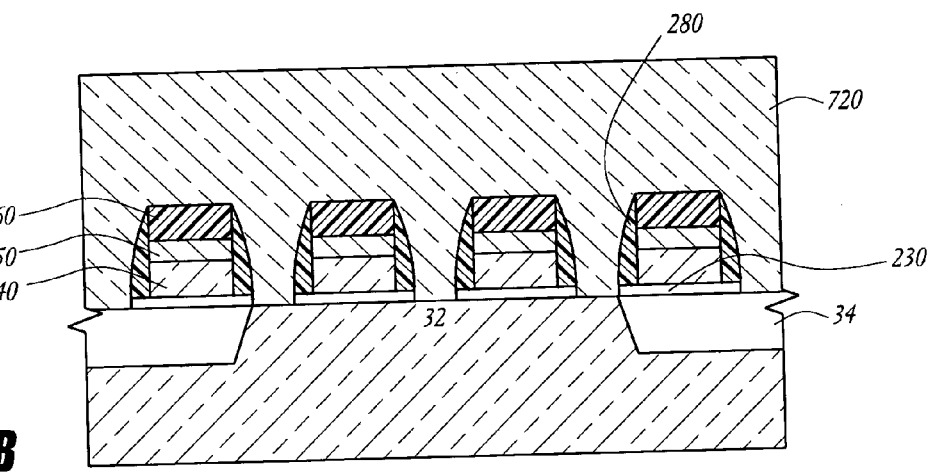
FIG. 7B
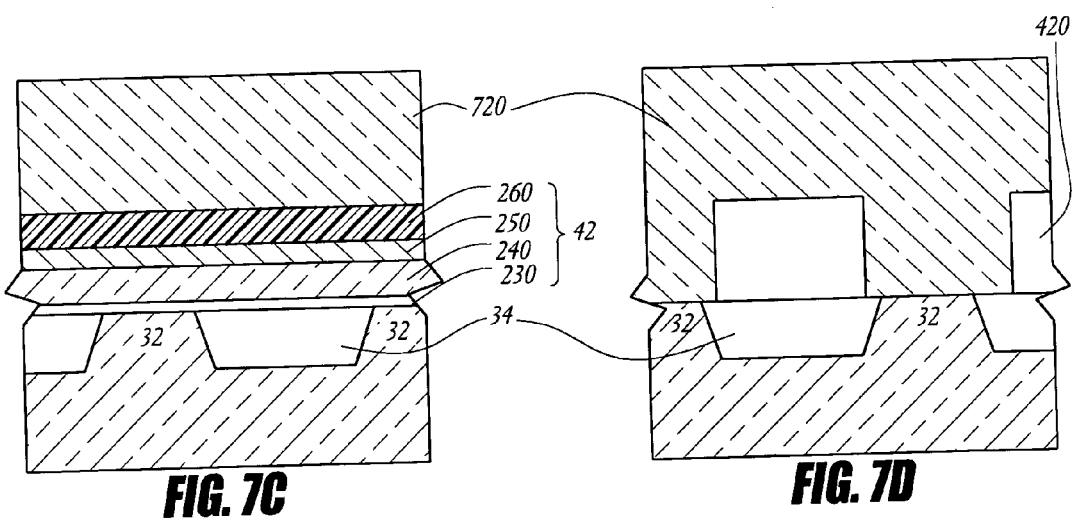
FIG. 7C
FIG. 7D

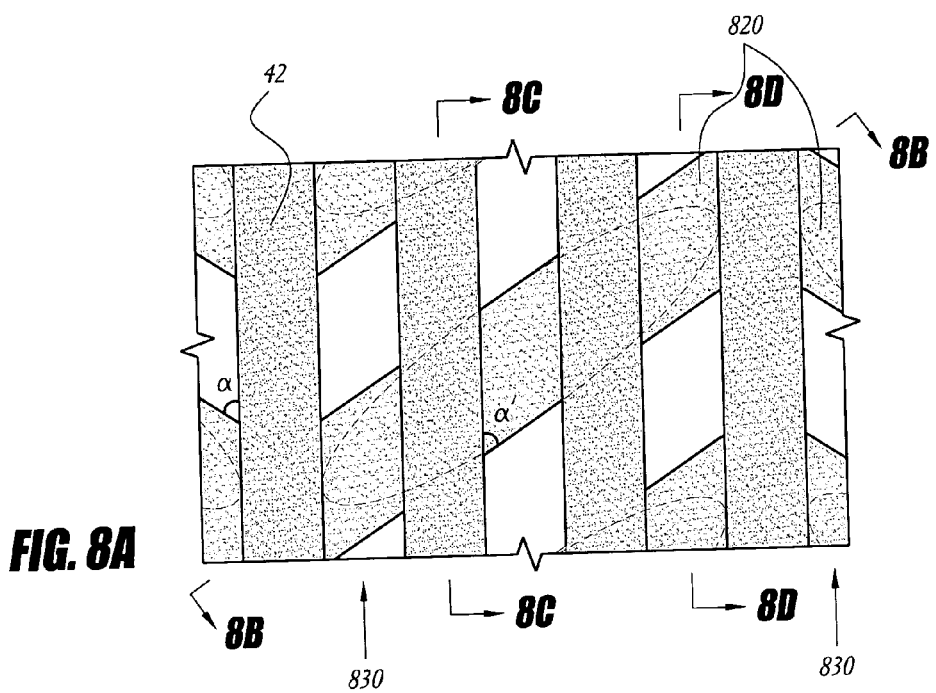
FIG. 8A
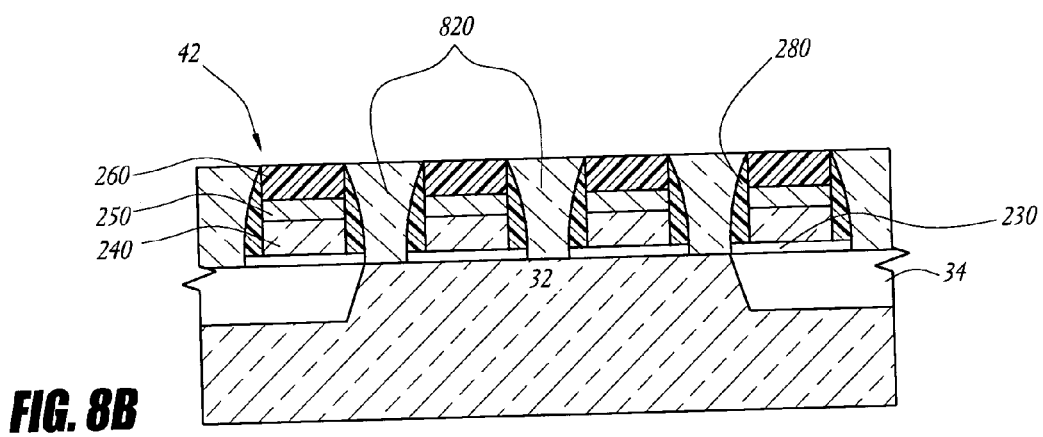
FIG. 8B
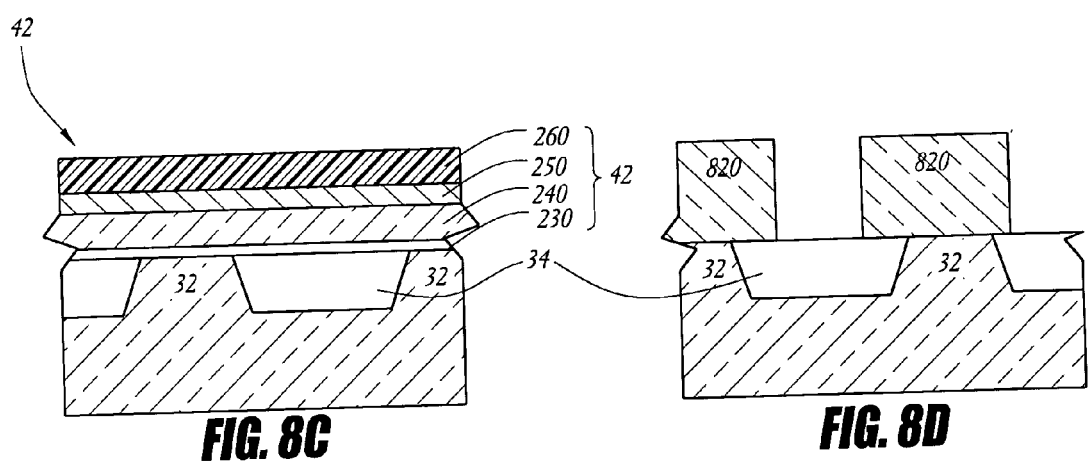
FIG. 8C
FIG. 8D

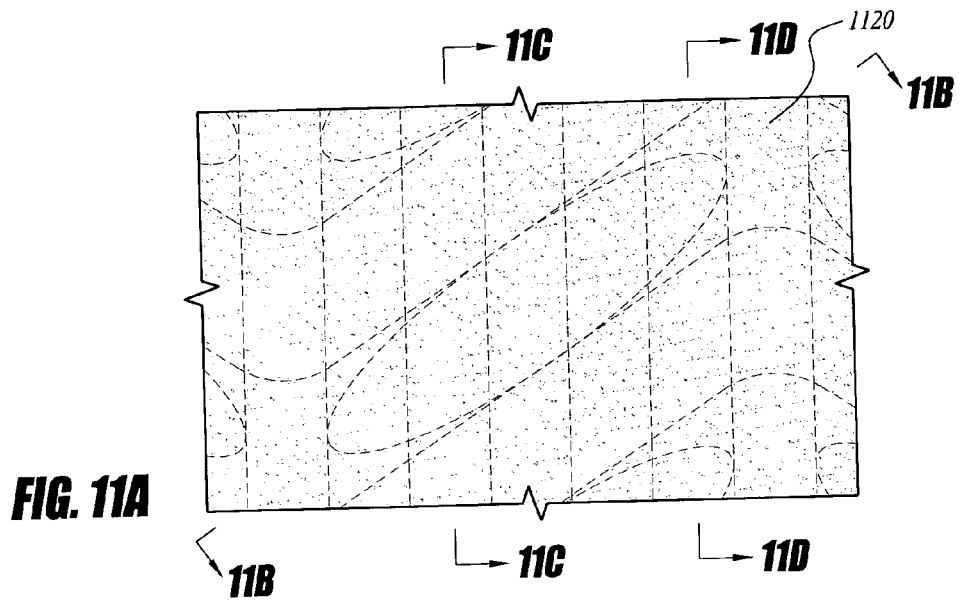
FIG. 11A
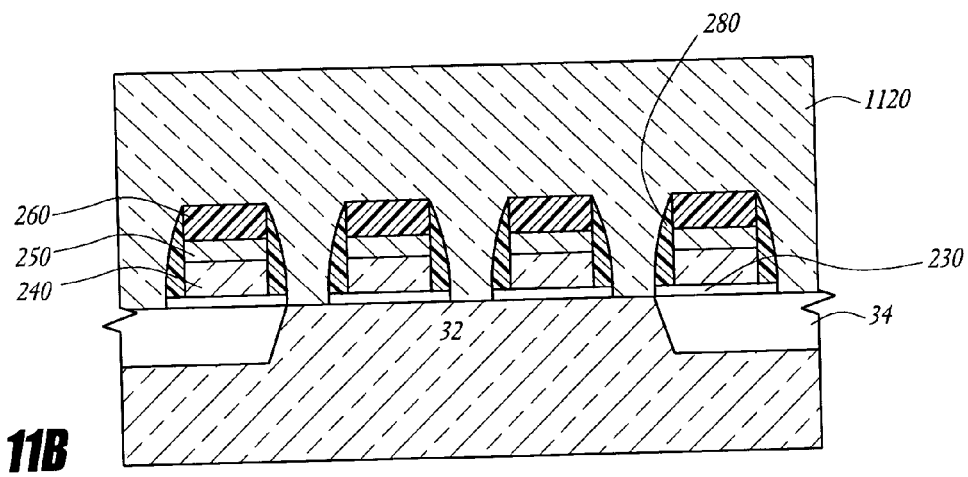
FIG. 11B
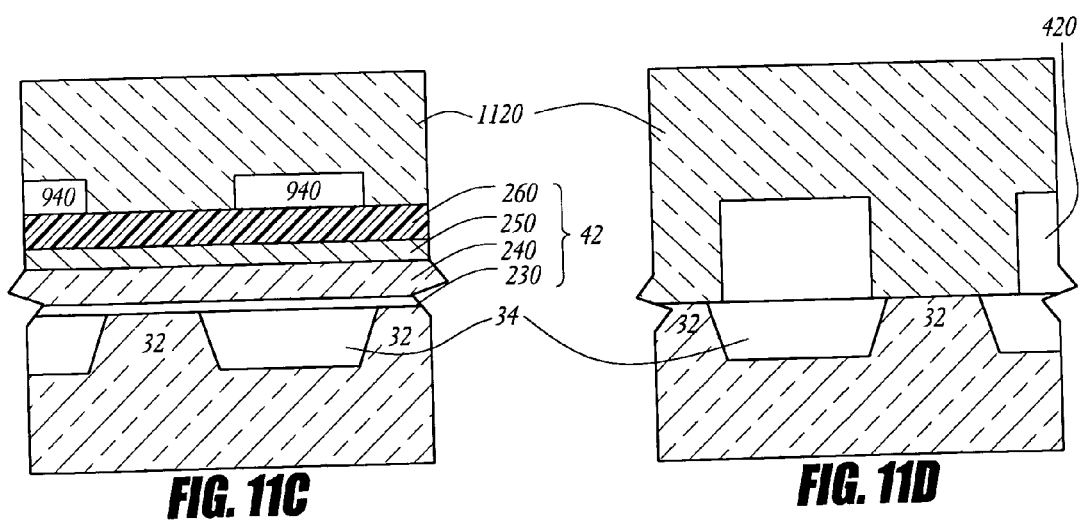
FIG. 11C
FIG. 11D

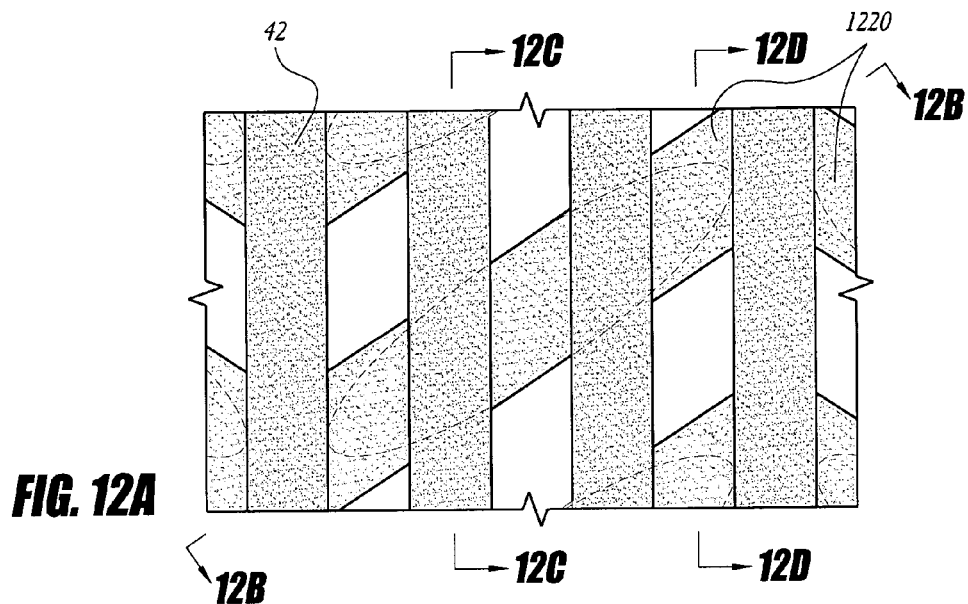
FIG. 12A
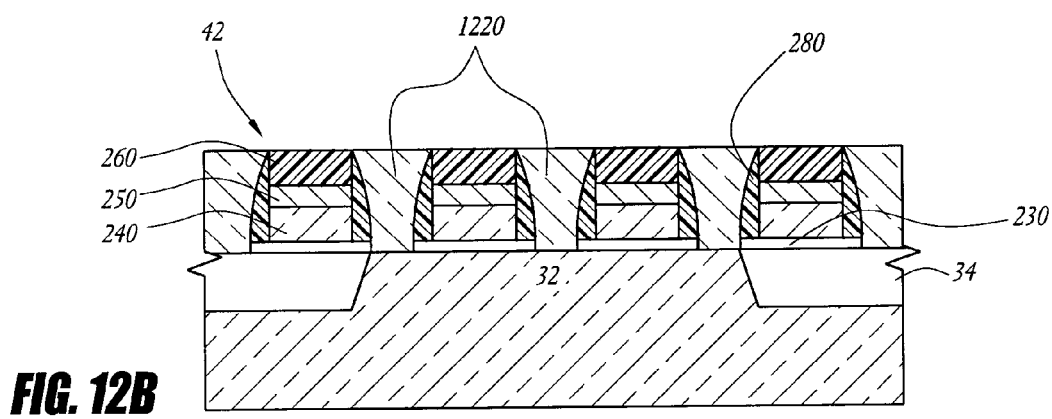
FIG. 12B
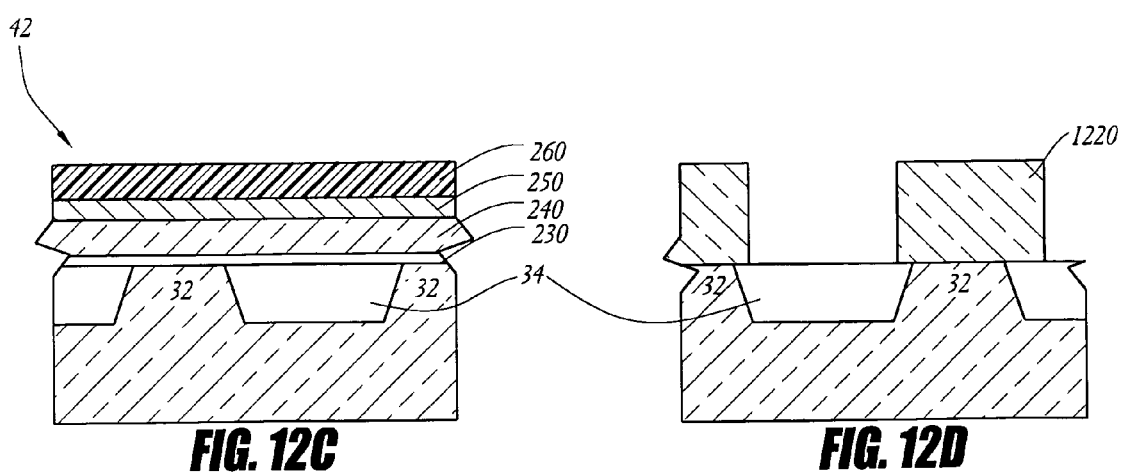
FIG. 12C  FIG. 12D

DISPOSABLE PILLARS FOR CONTACT FORMATION

RELATED APPLICATIONS

This application is related to pending U.S. patent application Ser. No. 10/690,317, filed Oct. 20, 2003, entitled FORMATION OF SELF-ALIGNED CONTACT PLUGS, the entirety of which is hereby incorporated by reference and made part of this specification.

BACKGROUND OF THE INVENTIONS

1. Field of the Inventions

The disclosed inventions relate generally to integrated circuit fabrication, techniques for fabrication of computer memory, and contact formation therefor.

2. Description of the Related Art

As a consequence of many factors, including demands for increased portability, computing power, memory capacity, and energy efficiency in modern electronics, integrated circuits are continuously being reduced in size. To facilitate these size reductions, the sizes of the constituent features, such as electrical devices and interconnect line widths, that form the integrated circuits, are also constantly being decreased.

The trend of decreasing feature size is most evident in memory circuits or devices, such as dynamic random access memories (DRAMs), static random access memories (SRAMs), ferroelectric (FE) memories, etc. To take one example, DRAM typically comprises millions of identical circuit elements, known as memory cells.

By decreasing the sizes of constituent electrical devices and the conducting lines that access them, the sizes of the memory devices incorporating these features can be decreased. Storage capacities for a given chip area can thus be increased by fitting more memory cells onto memory devices without increasing the overall size of the devices.

The continual reduction in feature size places ever greater demands on the techniques used to form the features. One well-known technique is photolithography, commonly used to pattern features, such as conductive lines, on a substrate. The concept of pitch can be used to describe the size of these features. For the repeating patterns typical of memory arrays, pitch is defined as the distance between an identical point in two neighboring features. Adjacent features are typically separated by a material, such as an insulator. As a result, pitch can be viewed as the sum of the width of the feature and of the width of the space or material separating that feature from a neighboring feature. Due to optical factors, such as lens limitations and light or radiation wavelength, photolithographic techniques have minimum pitches below which a particular photolithographic technique cannot reliably form features. This minimum pitch is commonly referred to by a variable defining one half of the minimum pitch, or feature size F. This variable is often referred to as a "resolution." The minimum pitch definable by photolithography, 2F, places a theoretical limit on feature size reduction.

One method for improving the density possible using conventional photolithographic techniques is to change the layout of a memory device in order to fit more memory cells in the same area without changing the pitch. Using such a method, the size of the memory device can be reduced without exceeding the minimum pitch, 2F, dictated by optical limitations. Alternatively, the memory device may be configured to hold more memory cells, while maintaining a constant pitch.

Memory layout changes, particularly those accompanied by increased feature density, and other factors have contributed to the need for improved subcomponent configurations and methods for forming subcomponents that are adapted to the memory layout changes.

SUMMARY OF THE INVENTIONS

Some embodiments comprise a method of forming an integrated circuit having multiple levels. The method can comprise the following steps: providing active areas; providing a plurality of word lines above the active areas; coating the word lines with a sacrificial material; patterning the sacrificial material in a first pattern having continuous lines and removing intervening portions of the sacrificial material that are not part of the first pattern; coating the patterned sacrificial material with an insulating material; planarizing the insulating material down to a first plane to expose portions of the sacrificial material; removing the exposed portions of the sacrificial material to leave voids; depositing a conductive material into the voids; and planarizing the conductive material to leave isolated plugs within the voids.

Some embodiments comprise an integrated circuit that includes a plurality of conductive plugs for use in an integrated circuit. The conductive plugs can comprise blocks of conductive material with a nonrectangular, parallelogram footprint, flanked on first and second opposite sides by two word lines and flanked on second and third opposite sides by blocks of insulating material, the blocks of conductive material being configured to contact underlying active areas and provide an electrical connection with an overlying bit line. The blocks of conductive material in the integrated circuit can be associated with a plan view pattern, the pattern comprising the following portions: first columns, each first column comprising a word line; second columns alternating regularly with the first columns, each second column comprising the box of conductive material, which alternate up and down the column with blocks of insulating material, the second columns arranged in ascending and descending trios. The ascending trios can comprise three sequential second columns having blocks of conductive material with parallelogram footprints, each parallelogram footprint having a top edge parallel to a bottom edge wherein the top and bottom edges of parallelogram slope upwardly to the right, and each top edge is aligned with the top edge of two other blocks of conductive material in other second columns in the ascending trios. The descending trios can comprise three sequential second columns having blocks of conductive material with parallelogram footprints, each parallelogram footprint having a top edge parallel to a bottom edge, wherein the top and bottom edges of the parallelogram slope downwardly to the right, and each top edge is aligned with the top edge of two other blocks of conductive material in other second columns in the descending trios.

Some embodiments comprise a memory device having a first component grouping. As seen in plan view, the first component grouping can comprise: a first elongate active area defining a first axis, the first active area comprising a first source and at least first and second drains; at least two substantially parallel word lines that cross and overly the first active area, at least a portion of a first word line located between the first drain and to the first source, at least a portion of a second word line located between the second drain and the first source; and a first plurality of contact plugs on the same vertical level as the word lines, the contact plugs comprising rhomboid portions of conductive material the first plurality of contact plugs contacting and generally overlying the first active area, at least one of the first plurality of contact plugs extending between the at least two word lines and at least one of the first plurality of contact plugs extending outwardly from either word line, each of the first plurality of contact plugs being aligned with the first axis.

Some embodiments comprise a method of forming conductive plugs for a computer memory array. The methods can comprise patterning a sacrificial material in continuous lines that cross word lines. The method can further comprise filling spaces between the sacrificial material and word lines with insulating material. The method can further comprise removing the sacrificial material to form plug voids, the plug voids being separated by word lines in one dimension and separated by the insulating material in another dimension. The method can further comprise filling the plug voids with conductive material to form conductive plugs. Some embodiments comprise a method of manufacturing a portion of the memory device. The method can include providing a substrate and a defining an elongate active area within the substrate, the axis of elongation of the active area defining a first axis. The method can further comprise defining at least one pair of word lines that define a second axis, the second axis crossing the first axis at an angle in a range of approximately 20 to approximately 80 degrees. Moreover, the method can comprise filling a space between the word lines and over the active area with a sacrificial material. The method can also comprise removing the sacrificial material and replacing it with a conductive material to form a conductive contact, the conductive material having two sides that are parallel to the first axis and two sides that are parallel to the second axis.

Some embodiments comprise a method of forming conductive plugs between transistor gates. The method can comprise patterning a sacrificial material in continuous zig-zag (in plan view) lines. The zig-zag lines having thinner (in cross-section) bridge portions that cross the transistor gates and thicker fill portions that fill the space between the gates. The method can further comprise removing at least the thicker fill portions to form voids with sidewalls formed from insulating material. The method, moreover, can comprise filling the voids with conductive material to form conductive plugs.

BRIEF DESCRIPTION OF THE DRAWINGS

The inventions will be better understood from the Detailed Description of the Preferred Embodiments and from the appended drawings, which are meant to illustrate and not to limit the inventions, and wherein:

FIG. 1A shows a plan view of a level with oval-shaped active areas. FIG. 1B shows a plan view of a level with word lines that overlie the active areas of FIG. 1A. FIG. 1B also shows (in phantom) where curved bit lines can be positioned relative to the structure of FIG. 1B.

In FIG. 2A and subsequent figures, the overlying lines are not depicted.

In FIGS. 2-12, the same structure is depicted in each of the schematic illustrations associated with a particular figure. Thus, FIGS. 2A-2C depict various views or sections of the same structure, FIGS. 2B, 3B, 4B, etc. show schematic, cross-sectional side views. (The cross section of FIG. 2B is taken along lines 2B-2B of FIG. 2A, FIG. 3B shows a cross section taken along lines 3B-3B of FIG. 3A, etc.) Similarly, FIGS. 2C, 3C, 4C, etc. show schematic, cross-sectional side views taken along lines C-C of the corresponding FIG. A.

FIGS. 2A-2C show the structure of two levels of an integrated circuit (including active areas in a first level and word lines in a second level) after coating the structure with a sacrificial material (e.g., photoresist and/or conformal amorphous carbon).

FIGS. 3A-3C show the structure of FIGS. 2A-2C after the sacrificial material of FIGS. 2A-2C has been patterned and partially removed, leaving behind lines of sacrificial material that cross portions of the word lines (shown in phantom) and that generally overlie the active areas (shown in phantom).

FIGS. 4A-4C show the structure of FIGS. 3A-3C after coating the structure with an insulating material (e.g., spin-on dielectric, or SOD) that fills in spaces between the lines of sacrificial material.

FIGS. 5A-5D show the structure of FIGS. 4A-4C after planarizing the insulating material and the sacrificial material down to the top of the word lines.

FIGS. 7A-7D show the structure of FIGS. 6A-6C after coating that structure with a conductive material (e.g., silicon) that fills in the voids left by removal of the sacrificial material.

FIGS. 8A-8D show the structure of FIGS. 7A-7D after planarizing the conductive material down to the top of the word lines.

FIGS. 9-12 show an alternative to FIGS. 5-8 that can be used to achieve the same structure depicted in FIGS. 8A-8C.

FIGS. 11A-11D show the structure of FIGS. 10A-10C after coating that structure with a conductive material (e.g., silicon) that fills in the voids left by removal of the sacrificial material.

FIGS. 12A-12D show the structure of FIGS. 11A-11D after planarizing the conductive material and the insulating material down to a plane that corresponds to the top of the word lines.

DETAILED DESCRIPTION OF THE PREFERRED EMBODIMENTS

Figure 1A:
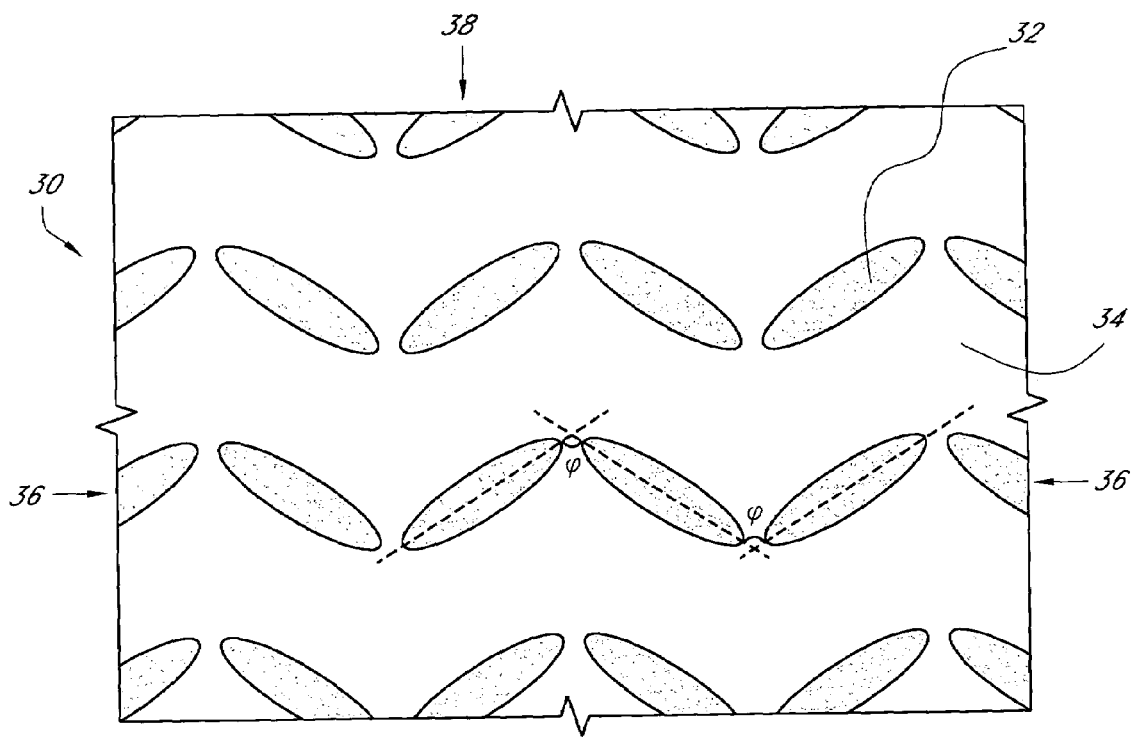
FIGS. 1A-1B schematically show two levels of an integrated circuit.

Referring to FIG. 1A, active areas 32 are schematically illustrated, forming a pattern in an active area level 30. In the illustrated embodiment, a pair of memory cells comprises three electrical devices: two storage capacitors and an access field effect transistor having a single source shared by the memory cells, two gates, two channels, and two drains. The pair of memory cells, therefore, has two addressable locations that can each store one bit (binary digit) of data. A bit can be written to one of the cells' locations through the transistor and read by sensing charge on the drain electrode from the source electrode site. In some embodiments, rows 36 of oval-shaped active areas 32 form a zig-zag pattern. From left to right across a row 36, the right-hand tip of each active area in a zig-zag row is near the left-hand tip of the subsequent active area in the zig-zag row. In the illustrated embodiment, the elongate axes of each of the oval active areas 32 in a particular row 36 are not aligned, but instead differ by an angle φ. Some embodiments have a symmetrical zig-zag pattern in that each successive intersection of elongate axes in a particular row 36 differs by the same angle φ. The angle φ can be in a range of approximately 45 degrees to approximately 179 degrees, for example. Preferably, the angle φ is approximately 130 degrees.

In some embodiments, columns 38 of oval-shaped active areas 32 do not have a zig-zag pattern. Thus, the elongate axes of each of the oval active areas 32 in a particular column 38 can be parallel, as shown. Thus, the repeating pattern of active areas can have a successive rows 36 of zig-zag lines that form a hound's tooth or herringbone pattern. The zig-zag configuration can have two slopes that intersect at an angle in a range of between 45 and 179 degrees, for example.

The active areas 32 are formed in a semiconductor material such as silicon. The active areas 32 are doped regions of a semiconductor substrate as shown in various cross-sectional views (see, e.g., FIG. 2B). The active areas 32 can be portions of a conductively doped silicon wafer that forms a substrate for an integrated circuit. The raised active areas 32 are surrounded in the same vertical level by insulating material or field isolation regions 34, which can be field oxide or shallow trench isolation material, for example.

Figure 13:
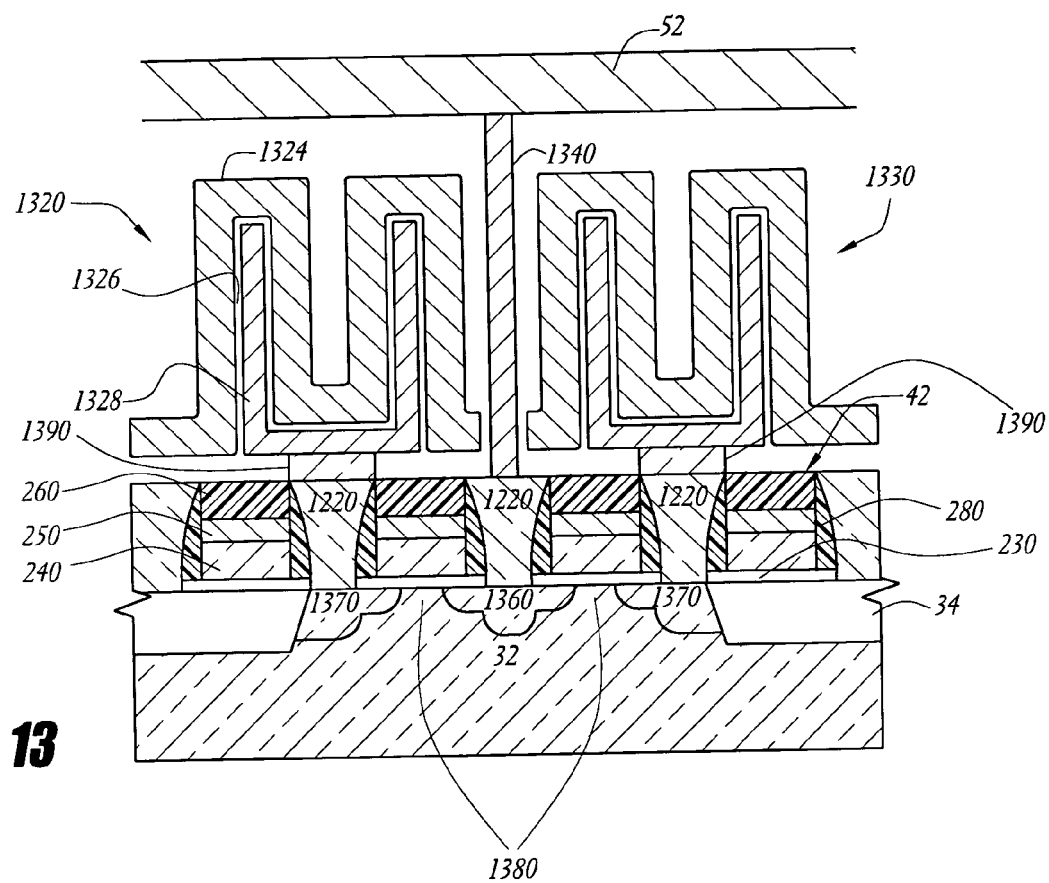
FIG. 13 shows a schematic, cross-sectional view of a bi-cell transistor configuration incorporating the structure of FIGS. 12A-12D.

In some embodiments, the active areas 32 comprise different regions that have different properties from one another. For example, the different regions can have different conductive properties. In the illustrated embodiments, each active area comprises a source region, as well as two channel regions and two drain regions. For an illustration of where these regions can be located within the active area 32, see FIG. 13. The silicon in the various regions of the active area can be doped differently. For example, in some preferred embodiments, the silicon in the source and drain regions has been heavily doped (e.g., n+), whereas the silicon in the channel regions has been less heavily doped with opposite conductivity type (e.g., p–). FIG. 13 shows how the source and drain regions can be oriented in the active area 32 with respect to other structures in an integrated circuit.

Figure 1B:
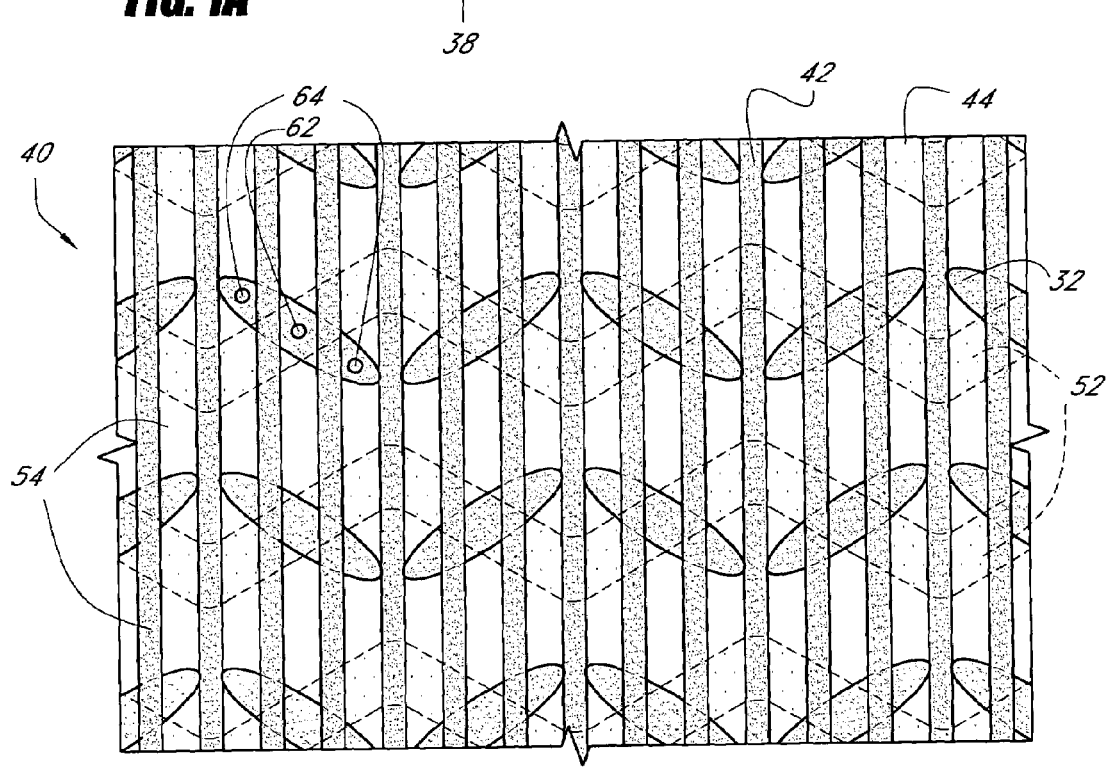

Referring to FIG. 1B, word lines 42 are schematically illustrated as stripes that cross the active areas 32 in an overlying word line level. The word lines 42 overlie the active areas 32, and each active area 32 contacts two word lines 42. In particular, the word lines 42 preferably contact the active area 32 in the channel regions of the active areas 32 (see FIG. 13). As can be understood from the cross-sectional views discussed below, the word lines 42 define insulated transistor gate electrodes where they cross the active areas 32. Thus, the active areas 32 can create an electrical connection between two insulated transistor gate electrodes, or word lines 42. The word lines 42 are separated by spaces 44, and the word lines 42 comprise multiple layers and/or portions that are illustrated in FIG. 2B.

As shown in FIG. 1B, the overlying bit lines 52 can be configured to cross over the central regions of the active areas 32. The central regions of the active areas 32 can correspond to the source regions of the active areas 32. The source regions can connect with the overlying bit lines 52 through bit line contacts 62. In the illustrated embodiment, spaces 54 between bit lines 52 cross over the peripheral regions of the active areas 32, which can correspond to the drain regions of the active areas 32. Cell contacts 64 connect the drain regions to memory storage devices (not shown), such as capacitors. As used in this specification, the term "bit line" also encompasses the structure sometimes referred to as a "digit line."

Figure 2A:
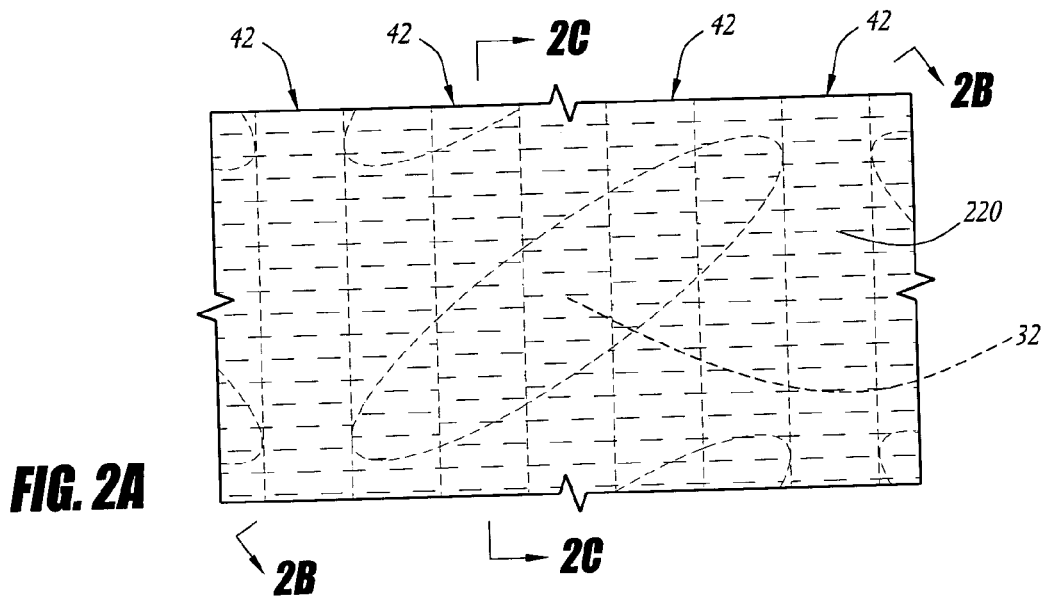
FIG. 2A and subsequent plan views show a close-up view of a smaller portion of the structure than is depicted in the plan views of FIGS. 1A-1B, with selected underlying structure shown in phantom.

Referring to FIG. 2A, a sacrificial material 220 has been deposited over the word lines 42 and the active areas 32, which are both shown in phantom. The sacrificial material 220 fills the spaces 44 between word lines 42, and thus portions of the sacrificial material 220 occupy the same vertical level as a word line level. In preferred embodiments, the sacrificial material 220 is photoresist or conformal amorphous carbon. These materials are advantageous because they can be removed with high selectivity, as discussed further below. The sacrificial material 220 preferably coats the word lines 42, and it is shown as a planarized layer in FIG. 2B. However, the layer 220 need not be smooth or planarized because a later CMP step will be used.

Figure 2B:
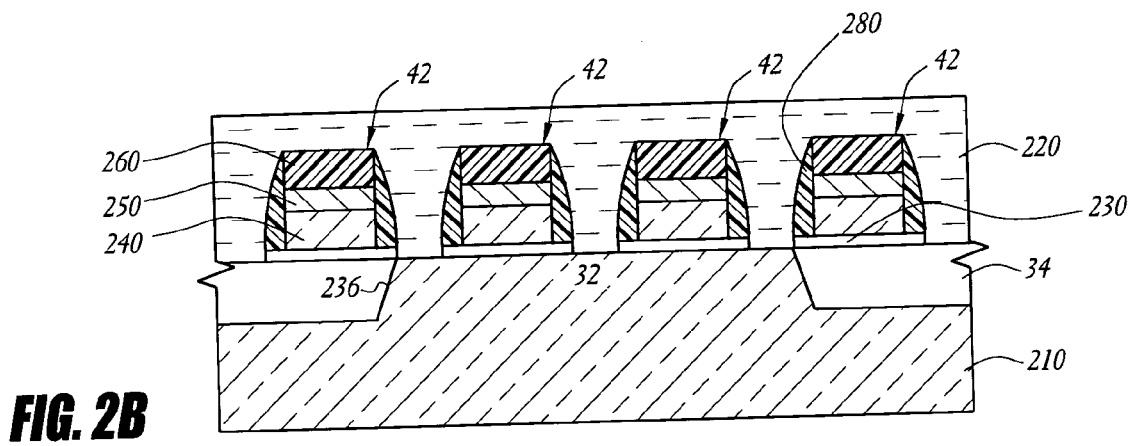

Referring to FIG. 2B, the sacrificial material 220, word lines 42, active areas 32, and insulating material or field isolation regions 34 are shown in cross section. The word lines 42 comprise multiple layered portions, including a gate dielectric portion 230, a first conductive portion 240, a second conductive portion 250, and an insulating cap portion 260. The gate dielectric portion 230 can extend across the whole active area at this stage. As illustrated, the word lines 42 are insulated from surrounding materials both by the insulating cap portions 260 and by word line spacers 280. The gate dielectric portions 230 can be formed from silicon oxide or high k materials such as $Ta_2O_5$, $HfO_2$ or $ZrO_2$. The first conductive portions can 240 can be formed from poly silicon, metal silicide, or newer materials and metal compounds with tailored work functions. The second conductive portions 250 can be formed from metal silicide, elemental metals and metal compounds with higher conductivity. The insulating cap portions 260 and the word line spacers 280 can be formed from silicon nitride, silicon oxide or similar dielectrics. As shown in FIG. 2B, the active areas 32 can be raised plateau portions of an underlying semiconductor substrate 210. The active areas 32 can have substantially vertical walls 236 that define the boundary between the active areas 32 and the insulating material or field isolation regions 34. Alternatively, the walls 236 can be sloped as shown.

Figure 2C:
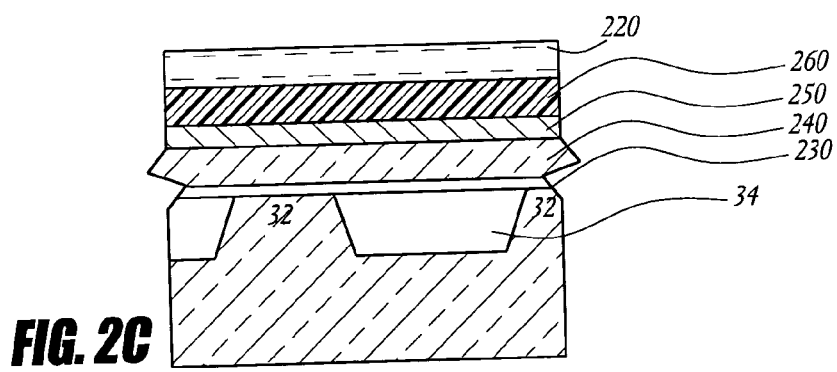

Referring to FIG. 2C, a cross section taken along lines 2C-2C shows a different perspective of the layered configuration of the partly-formed integrated circuit.

Figure 3A:
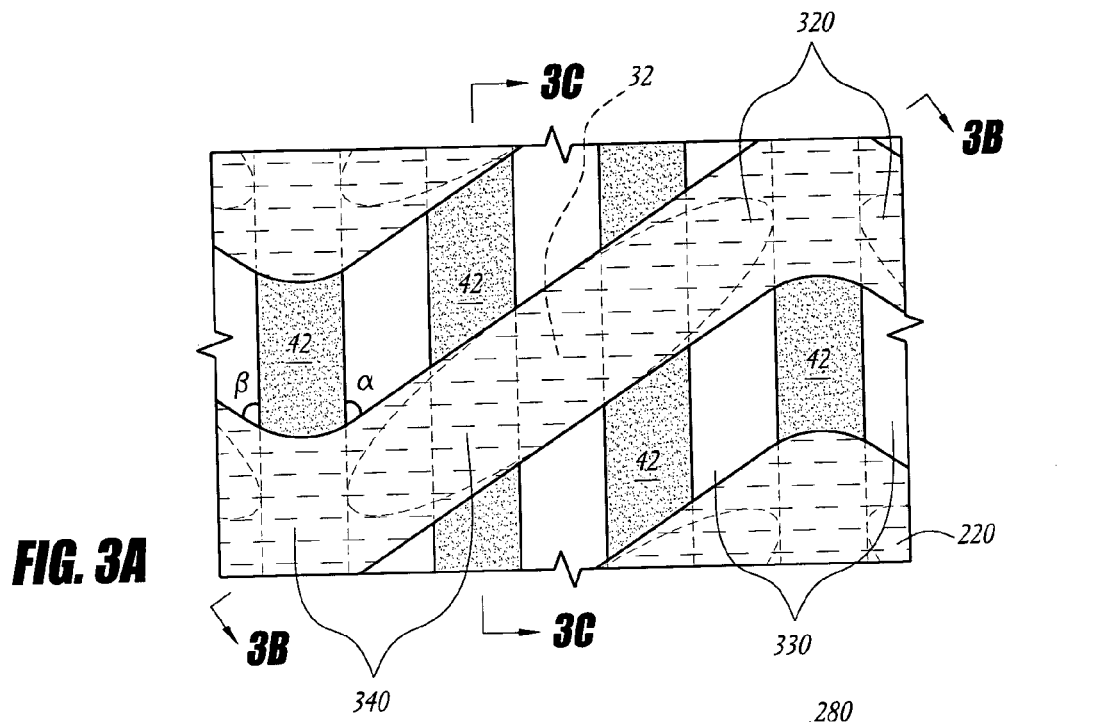
FIGS. 3A-3C depict different views or sections of the same structure, etc. Furthermore, the letter labels of sub-figures indicate consistent views. Thus, FIGS. 2A, 3A, 4A, etc. each show schematic plan views; if underlying structure is depicted, it is shown in phantom.

Referring to FIG. 3A, the sacrificial material 220 has been patterned in a continuous wavy line or zig-zag pattern such that portions of the sacrificial material 220 are intact over each row 36 (FIG. 1A) of active areas 32. The lines of sacrificial material 220 generally follow the contours of successive oval-shaped active areas 32 (shown in phantom), extending the length of one active area 32, bridging to cover another active area 32, bridging to cover yet another active area 32, and so forth from left to right in the illustrated view. As illustrated, the lines of sacrificial material 220 cross over portions of the word lines 42 as well as the spaces 44 (FIG. 1B) between word lines.

The pattern of continuous zig-zag lines of sacrificial material can effectively overlie the various active areas 32, having similar angles and intersecting elongate axes in a way similar to the above description of the rows 36 of active areas 32 (see FIG. 1). In particular, each zig-zag row of sacrificial material can overlie a row 36 of active areas 32.

Because the elongate axes of a particular column 38 (see FIG. 1A) of oval active areas 32 are aligned or parallel, successive zig-zag rows 36 of active areas can form a hound's tooth pattern as discussed above with respect to FIG. 1A. Furthermore, the zig-zag rows of patterned sacrificial material generally overlie the rows 36 of active areas 32. Thus, the zig-zag lines of patterned sacrificial material do not overlap with each other and have zig-zag lines of space in between them. The illustrated embodiment has a constant separation distance between each zig-zag line. In some embodiments, the continuous wavy lines intersect the word lines 42 at an angle between 10 and 80 degrees. For example, in FIG. 3A, one of the wavy zig-zag lines intersects one of the word lines 42 at an angle α. In some embodiments, the angle α is the same as an angle β. Such a symmetrical configuration can make it easier to pattern large arrays of structures such as those described herein. In some embodiments, the angle φ is twice the angle α.

Patterning the sacrificial material 220 in a continuous line can provide higher resolution than would otherwise be possible with a more disjointed pattern having discreet elements (not shown). The sacrificial material 220 can be patterned through a photolithographic process. For example, if the sacrificial material 220 is photoresist, conventional photolithography can be used. In some embodiments, where the sacrificial material 220 is amorphous carbon, for example, a dry develop etch process can be used to pattern the sacrificial material 220. In particular, a dry develop process can involve dry-developing the resist and removing material that is not protected by the resist, then stripping the resist pattern to leave behind lines of amorphous carbon over the active areas.

With continued reference to FIG. 3A, after the zig-zag pattern of sacrificial material 220 has been formed and portions of the sacrificial material coating have been removed as shown, there are voids 330 in the spaces 44 (FIG. 1B) between word lines 42, and the voids 330 are flanked above and below (in plan view) by the thicker portions 320 of the lines of sacrificial material 220. (The lines of sacrificial material also have thinner portions 340, where the lines cross over the word lines 42). Thus, the sacrificial material 220 has been patterned in a pattern having continuous lines, and the portions of intervening sacrificial material that are not part of the pattern have been removed.

Figure 3B:
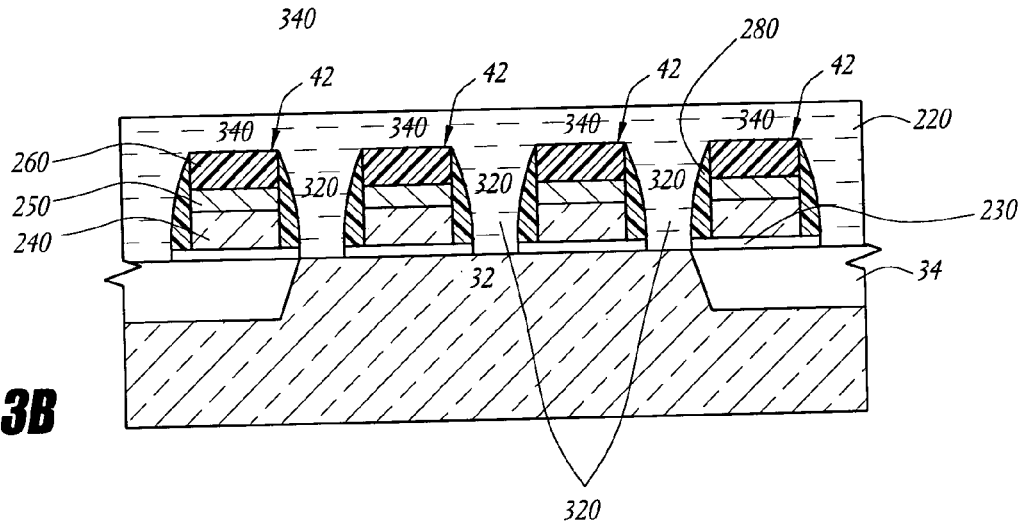

Referring to FIG. 3B, which shows a cross section of the structure illustrated in FIG. 3A, the lines of sacrificial material 220 have thicker portions 320 in between the word lines 42 and thinner portions 340 as the sacrificial material 220 crosses over the top of the word lines 42. Furthermore, FIG. 3B illustrates the wordline spacers 280 that provide insulating material between the inner portions of the wordlines 42 and the materials external to the wordlines 42. In particular, the wordline spacers 280 flank the left and right sides (in plan view) of the voids 330. Thus, the voids 330 are surrounded by four insulating side walls, two formed from the thicker portions 320 and two formed from the wordline spacers 280.

Figure 3C:
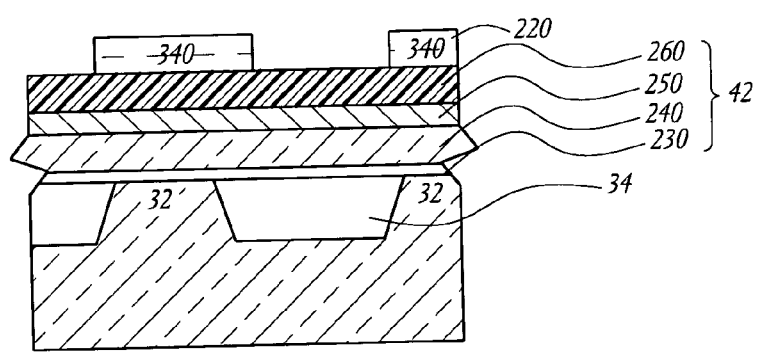

Referring to FIG. 3C, the illustrated cross section is taken along one of the word lines 42, and thus shows two thinner portions 340 of sacrificial material 220.

Figure 4A:
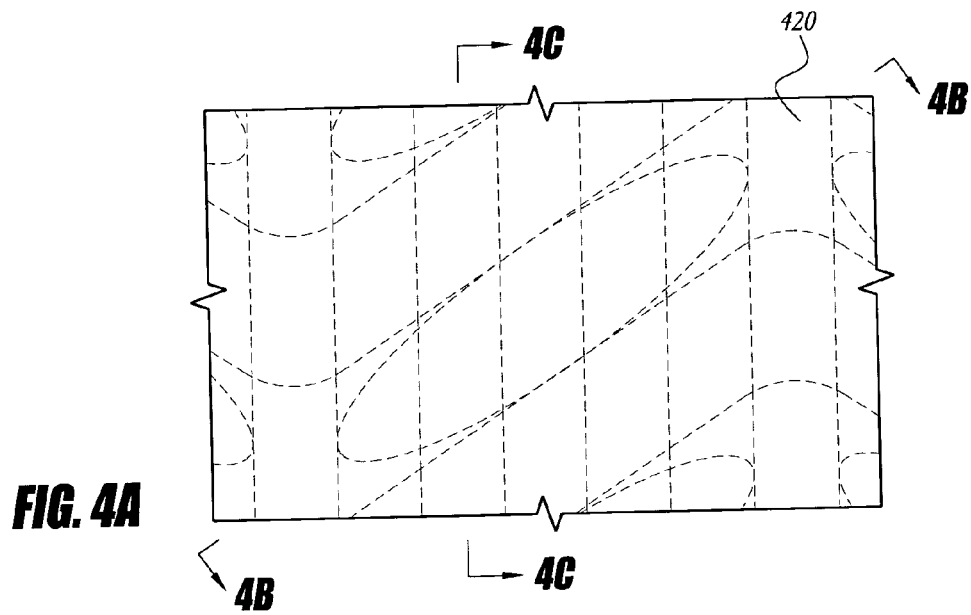

Referring to FIG. 4A, a coating of insulating material 420 has been applied to the structure of FIGS. 3A-3C. The insulating material 420 has filled in the voids 330 (FIG. 3A). The insulating material 420 is deep enough, in the depicted embodiment, to cover all the structure of FIGS. 3A-3C. The insulating material 420 can be a spin-on dielectric (SOD). The insulating material 420 can be densified at this point, or later as indicated below.

Figure 4B:
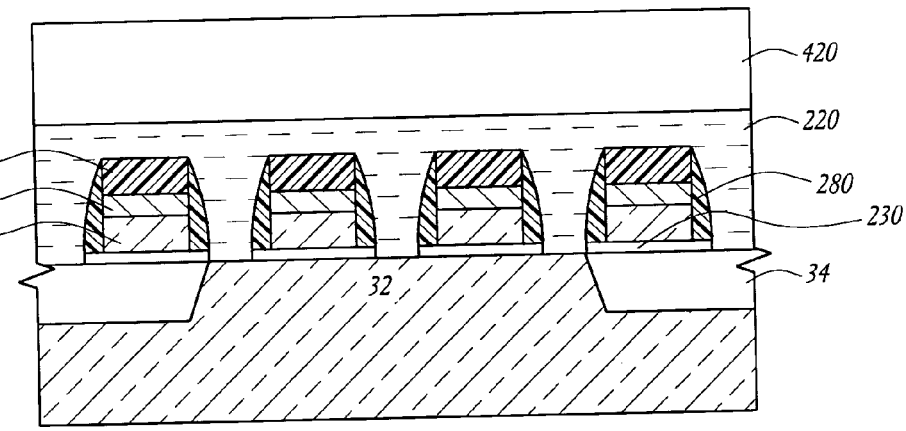
Figure 4C:
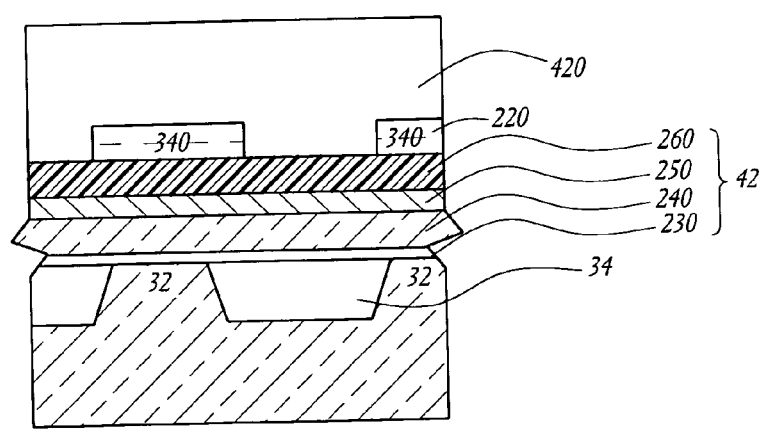

Referring to the cross-sectional views of FIGS. 4B and 4C, the insulating material 420 is shown covering the sacrificial material 220.

Referring to FIG. 5A, both the sacrificial material 220 and the insulating material 420 have been planarized (if not already planar) and etched back. In the illustrated embodiment, both materials have been removed generally down to a plane that corresponds to the top of the word lines 42. The remaining portions of the sacrificial material 220 form pillars 520. The pillars 520 are defined and surrounded by the word lines 42 to the left and right (in FIG. 5A), and by insulating material 420 to the top and bottom (in FIG. 5A). The pillars 520 have parallelogram "footprints." Preferably, the pillars 520 have rhomboidal footprints. As used herein, a footprint refers to an object's shape when it is seen from a top or bottom plan view, for example when a cross-section of the object is taken along a plane parallel to the plan of the plan view of FIG. 5A, for example. In the illustrated embodiment, the pillars 520 have parallelogram, rhomboid footprints as seen in the plan view, each parallelogram having an interior angle α' that corresponds to the angle α. The angle α' is an interior angle of the rhomboid represented by the footprint of the pillar 520. The angles α' and α are preferably in a range between 10 and 80 degrees. Thus, in the illustrated embodiment of FIG. 5A, the parallelograms are non-rectangular. In particular, the illustrated parallelograms are rhomboids.

Referring to FIG. 5B-5D, planarization has removed the thinner portions 340 (FIG. 3B) of the sacrificial material 220, but left the pillars 520 (corresponding to the thicker portions 320 of FIG. 3B) that are located in between the word lines 42 generally intact. The pillars 520 generally overlie portions of the active areas 32, as illustrated by FIG. 5D. Planarization can be accomplished using an etch step with a mechanical component, such a chemical mechanical polishing (CMP) etch. Other processes that can be used to planarize include selective dry etch back processes. In a preferred embodiment, CMP is used and when the CMP reaches the level of the insulating cap portions 260 of the word lines 42, the CMP is halted. Because the insulating cap portions 260 can be formed from nitride, CMP can be referred to as a "stop-on nitride" (or SON) process. Alternatively, the described CMP etch can be referred to as a SON CMP etch.

Figure 6A:
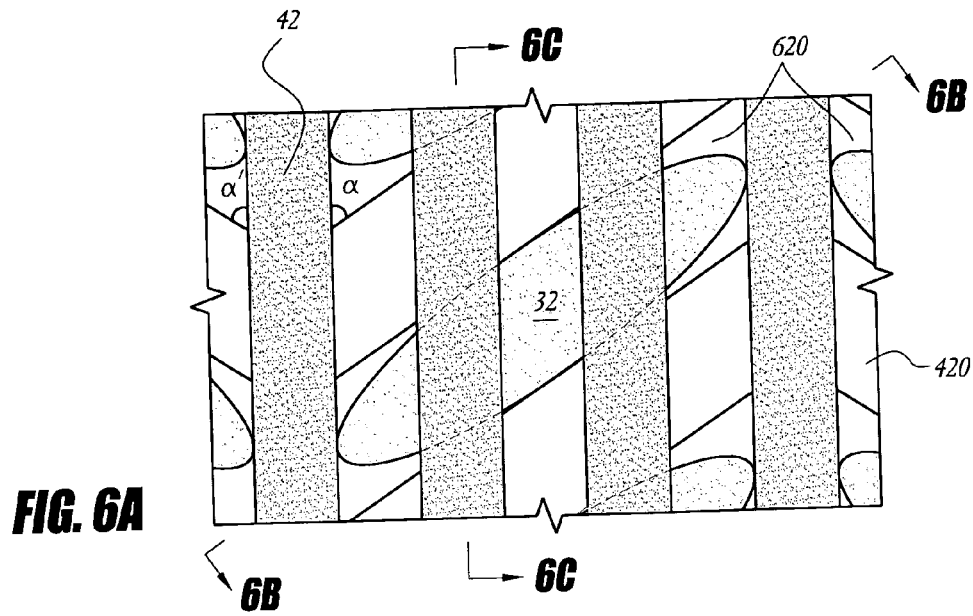
FIGS. 6A-6C show the structure of FIGS. 5A-5D after selectively removing the remaining portions of the sacrificial material.

Referring to FIG. 6A, the sacrificial material 220 that remained after planarization has been removed, leaving plug voids 620 in between word lines 42. In the spaces 44 (FIG. 1B), remaining portions of insulating material 420 form periodic blocks of material that alternate with the plug voids 620. The plug voids 620 leave portions of the active areas 32 exposed. The plug voids 620 can have the same shape and angle characteristics of the removed pillars 520 (FIGS. 5A-5D) of sacrificial material. For example, in the illustrated embodiment, the plug voids 620 have parallelogram footprints as seen in the plan view, each parallelogram having an interior angle α' that corresponds to the angle α. The angle α' is an interior angle of the parallelogram represented by the footprint of the void 620. The angles α' and α are preferably in a range between approximately 10 and approximately 80 degrees. Thus, in the illustrated embodiment of FIG. 6A, the parallelograms are non-rectangular. In particular, the parallelograms are preferably rhomboids.

The sacrificial material 220 can be removed by a selective etch step. For example, if the sacrificial material 220 is photoresist, an oxygen plasma etch can be used. If the sacrificial material 220 is amorphous carbon, a similar or sulfur/oxygen plasma can be used. If the remaining insulating material has not already been densified, it can be densified after the sacrificial material 220 has been removed as illustrated.

Figure 6B:
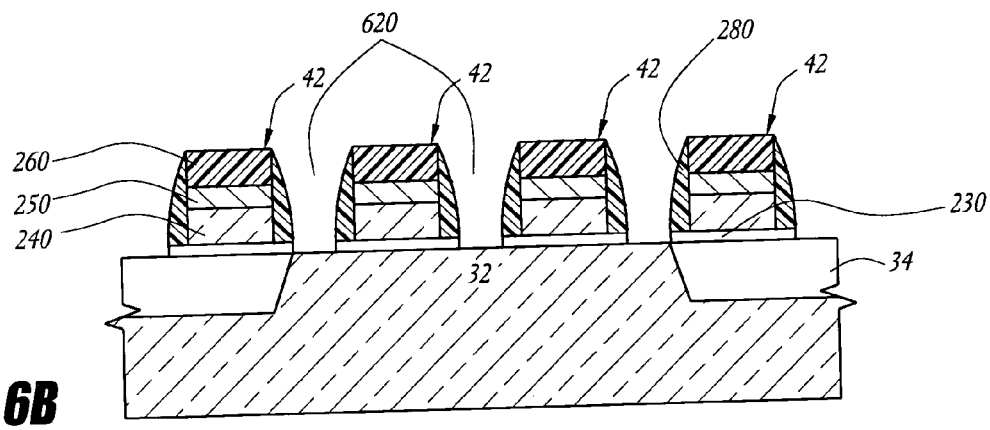

Referring to FIG. 6B, in the illustrated cross section, the free-standing word lines 42 alternate with plug voids 620. The back wall of the insulating material 420 is omitted to more clearly illustrate the voids 1020.

Figure 6C:
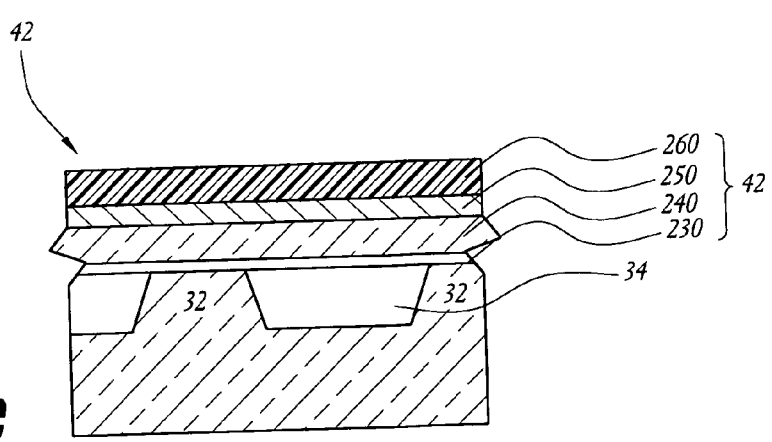

Referring to FIG. 6C, the cross-section taken along the word line 42 is unchanged from the structure shown in FIG. 5C.

Referring to FIG. 7A, the structure of FIG. 6A has been coated with a conductive material 720, which has filled the plug voids 620 left by removal of the sacrificial material 220. The conductive material 720 can be silicon, polysilicon, metal, tungsten, titanium, or a laminated conductor, for example. In some embodiments, polysilicon is preferred because it can withstand processing temperatures. In the illustrated embodiment, the conductive material 720 forms the plugs that fill the plug voids 620.

Referring to FIGS. 7B and 7C, cross-sectional views of the conductive material 720 overlying the structure of FIGS. 6B and 6C are shown. Referring to FIG. 7D, a cross sectional view taken along the line 7D-7D of FIG. 7A is shown.

Referring to FIG. 8A, the conductive material 720 has been planarized such that all material above a plane generally corresponding to the top of the word lines 42 has been removed. Etch back processes or CMP, as described above with respect to FIGS. 5A-5D, can also be used to achieve the structure illustrated in FIGS. 8A-8D. The planarization has created plugs 820 from the conductive material 720. The conductive plugs 820 can fill the role of bit line contacts (see bit line contacts 62 in FIG. 1B above) or cell contacts (see cell contacts 64 in FIG. 1B above), depending on their position with respect to an underlying active area 32. The conductive plugs 820 form conductive contacts with the underlying active areas 32 by passing down between the word lines 42. By removing the sacrificial material 220 to form the voids 620 (FIGS. 6A-6B), the plugs 820 can be formed by coating the structure and planarizing, as shown. Furthermore, the conductive plugs 820 are self-aligned in that the voids allow the conductive material 720 to fill in to form plugs 820 that are directly aligned with the underlying active areas 32 and do not require a mask step after depositing the conductive material. As described above with respect to the pillars 520 of sacrificial material 220 and the voids 620, in the illustrated embodiment, the plugs 820 can have parallelogram (e.g., rhomboid) footprints as seen in the plan view, each parallelogram having an interior angle α' that corresponds to the angle α. The angle α' is an interior angle of the parallelogram represented by the footprint of the pillar 520. The angles α' and α are preferably in a range between 10 and 80 degrees. In particular, the parallelograms are preferably rhomboids.

As seen in the plan view of FIG. 8A, the illustrated plugs 820 have a non-rectangular parallelogram footprint. In the illustrated embodiment, the opposing top and bottom sides of each plug 820 are either ascending from right to left, as with the plugs 820 overlying the central active area 32 in FIG. 8A, or they are descending from right to left, as is the case with some of the plugs 820 which are only partially visible in FIG. 8A. For example, if the word lines 42 form columns (in plan view) as illustrated in FIG. 8A, the lines 42 alternate with columns 830 formed from the plugs 820 and blocks of insulating material with complementary shapes, the two parallelogram (or rhomboid) blocks alternating in a striped pattern in the columns 830 up and down (in the view of FIG. 8A) between word lines 42. As illustrated, the angles of the stripes in the columns formed between word lines 42 corresponds to the angle of the elongate axis of the underlying active areas 32. In particular, three striped columns 830 and two word lines 42 cross each active area 32. The striped columns 830 are grouped in ascending trios where they cross active areas 32 that slope upwardly to the right, and in descending trios where they cross active areas 32 that slope downwardly to the right.

Referring to FIGS. 8B-8D, the cross sectional views show how the plane of planarization corresponds to the top of the word lines 42. The illustrated planarization can be achieved using an etch step with a mechanical components, such as chemical mechanical polishing. Other processes that can be used to planarize include a selective dry etch or a non-selective dry etch timed to stop after reaching the top of the word lines 42 or otherwise configured (e.g., with optical end point detection) to end after exposure of the insulating caps 260. As illustrated by FIG. 8D, the plugs 820 generally overlie the active areas 32. The two plugs 820 illustrated in FIG. 8D can function as cell contacts because they overlie the end regions of the active areas 32. In FIG. 8D, the side wall of the wordline 42 that would otherwise be visible in such a cross-sectional view has been omitted to more clearly illustrate the lack of structure between the plugs 820 along the column 830 (FIG. 8A).

FIGS. 9-12 show an alternative embodiment to that described in FIGS. 5-8. Indeed, the two alternative processes can be used to achieve similar structure, as shown by FIGS. 8 and 12.

Figure 9A:
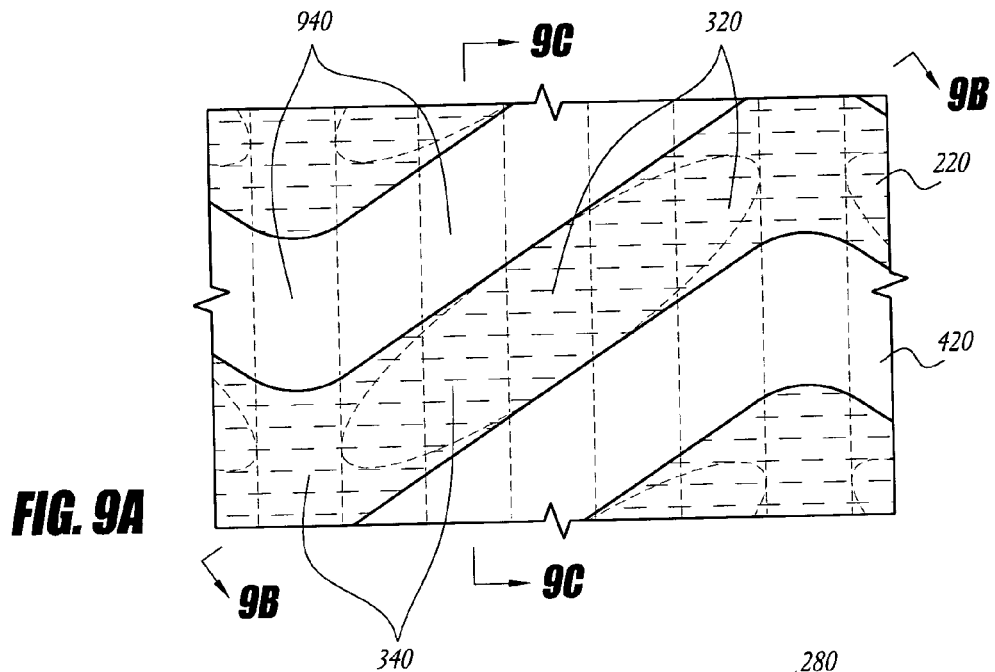
FIGS. 9A-9C show the structure of FIGS. 4A-4C after planarizing the insulating material down to the top of the sacrificial material.

Referring to FIG. 9A, the insulating material 420 of FIGS. 4A-4C has been planarized. In this embodiment, the insulating material 420 has been removed generally down to a plane that corresponds to the top of the sacrificial material 220 above the insulator word line. Because planarization has been stopped earlier than the step described at FIG. 5 above, this etch step leaves intact the thicker portions of the insulating material 420 and the sacrificial material 220.

Figure 9B:
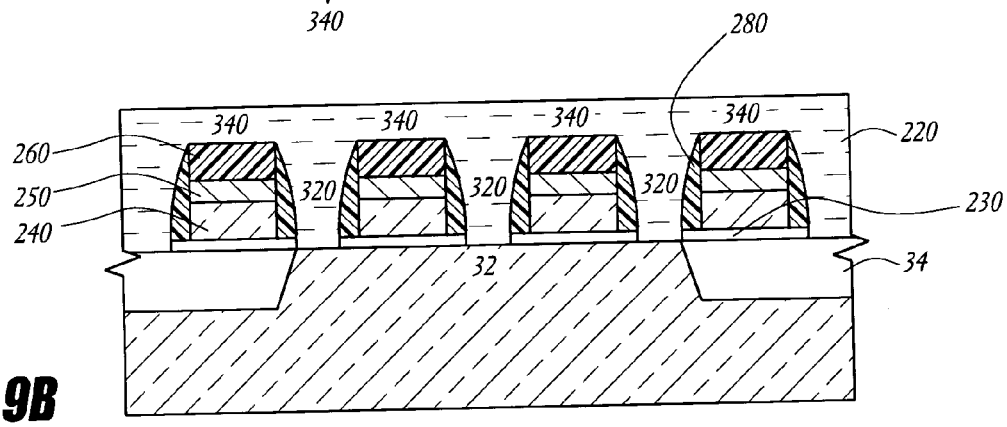
Figure 9C:
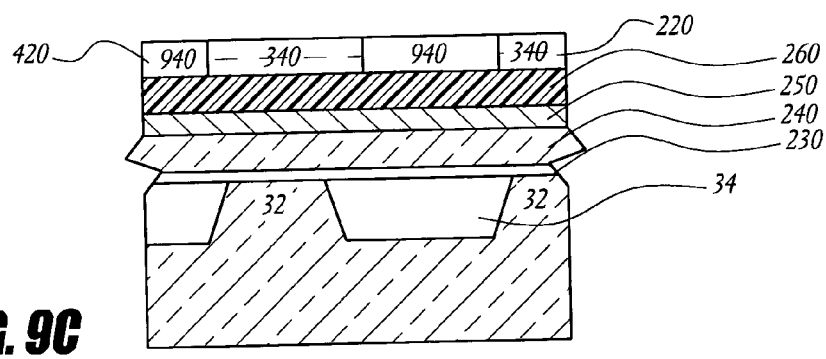

Referring to FIGS. 9B and 9C, planarization has left intact the thinner portions 340 of the sacrificial material 220, in contrast to the planarization illustrated in FIGS. 5B and 5C, which removed the thinner portions 340. As can be seen from FIG. 9C, the thinner portions 340 of sacrificial material 220 are interspersed between thin portions 940 of insulating material 420, which also crosses the word lines 42.

Planarization can be accomplished using an etch step with a mechanical component, such as chemical mechanical polishing. Other processes that can be used to planarize include dry etching timed or otherwise configured (e.g. by optical endpoint detection) to stop on the sacrificial material 220.

Figure 10A:
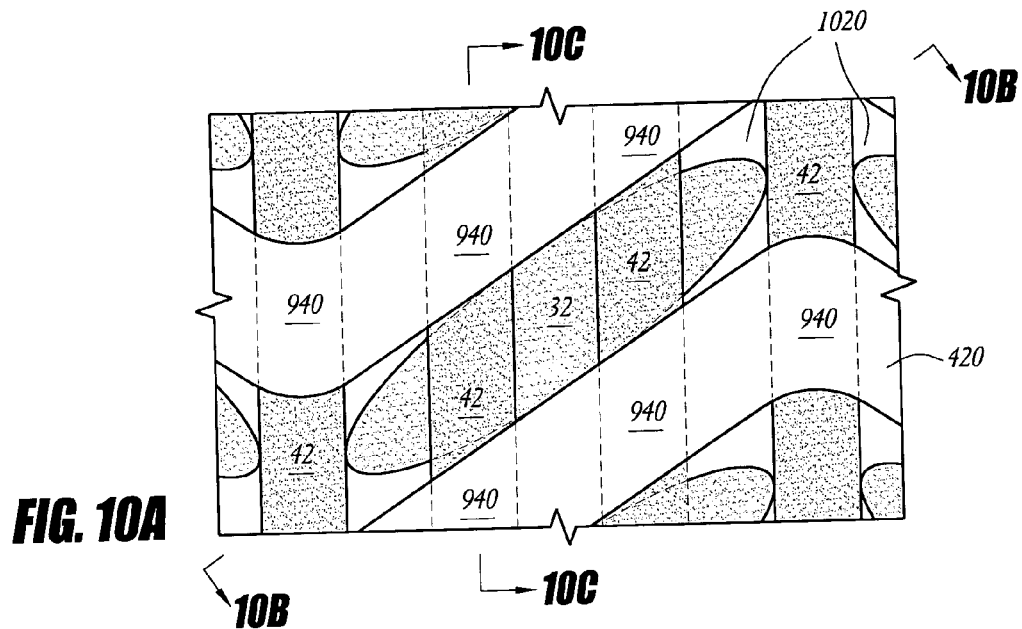
FIGS. 10A-10C show the structure of FIGS. 9A-9C after removing the remaining portions of the sacrificial material.

Referring to FIG. 10A, the sacrificial material 220 that remained after planarization has been removed, leaving deep plug voids 1020 bordered by the word lines 42 and the wavy lines of insulating material 420. The deep plug voids 1020 are different from the plug voids 620 illustrated in FIG. 6 because the insulating material that forms two walls of each void is taller for the deep plug voids 1020 in FIG. 10A. However, the word lines 42 that form the other two walls of each void are the same height for the plug voids 620 and the deep plug voids 1020. Furthermore, despite their differences, the deep plug voids 1020 leave portions of the active areas 32 exposed, just as did the plug voids 620 illustrated in FIG. 6.

The sacrificial material 220 can be removed by a selective etch step. For example, if the sacrificial material 220 is photoresist, a dry develop or oxygen plasma etch can be used. If the sacrificial material 220 is amorphous carbon, an oxygen plasma or $SO_2$-based plasma can be used.

If the remaining insulating material 420 has not already been densified, it can be densified after the sacrificial material 220 has been removed as illustrated. In some embodiments, densified material can be easier to remove than nondensified material. In some embodiments that use photoresist (as the sacrificial material 220) and SOD (as the insulating material 420), densification at this point is advantageous because photoresist may not be able to withstand the cure temperatures of SOD. In some embodiments, furthermore, even if amorphous carbon is used as the sacrificial material 220, that amorphous carbon may not be able to withstand some temperatures (e.g., in a range of approximately 500 to 600 degrees Celsius). In this case, removing all of the sacrificial material 220 before densification of the insulating material 420 (e.g., of SOD) can allow for higher curing temperatures and/or longer cure times, providing more processing flexibility.

Figure 10B:
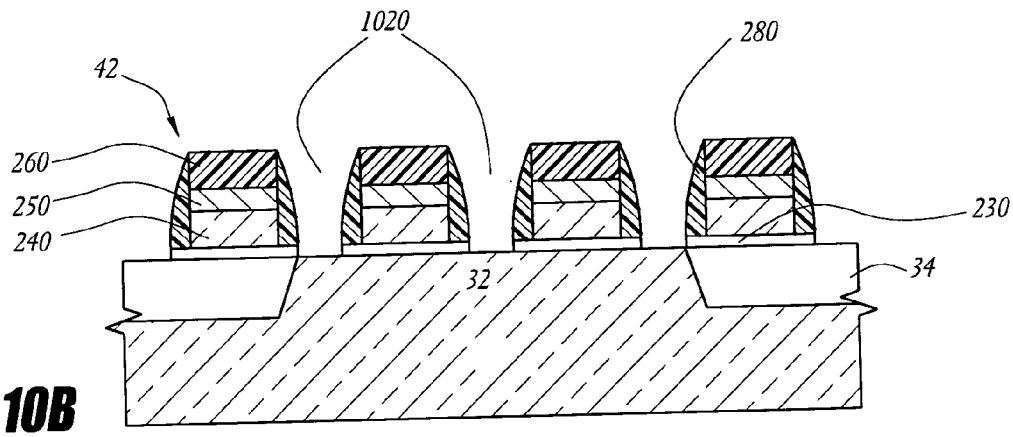

Referring to FIG. 10B, in the illustrated cross section, the free-standing word lines 42 alternate with plug voids 1020. The back wall of the insulating material 420 is omitted to more clearly illustrate the voids 1020.

Figure 10C:
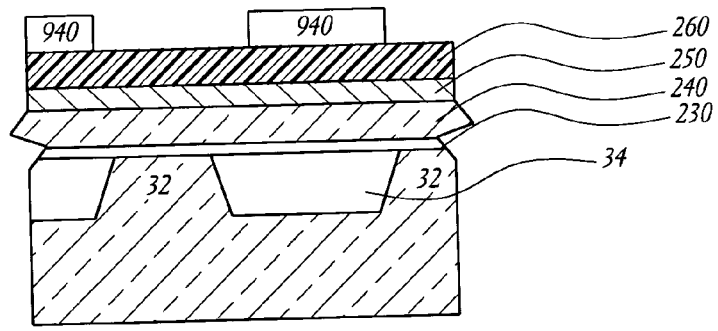

Referring to FIG. 10C, the cross-section taken along the word line 42 illustrates that removal of the sacrificial material has resulted in the absence of the thinner portions 340 of sacrificial material 220, but that the thin portions 940 of insulating material 420 are still in place generally on the word lines 42 where they cross the insulating material or field isolation regions 34.

Referring to FIG. 11A, a coating of conductive material 1120 has been added to the structure illustrated in FIG. 10A. The conductive material 1120 has filled the deep plug voids 1020 left by removal of the sacrificial material 220. The conductive material 1120 can be silicon, tungsten or any other suitable plug material. In the illustrated embodiment, the conductive material 1120 forms the plugs that fill the plug voids 1020.

Referring to FIGS. 11B and 11C, cross-sectional views are shown of the conductive material 1120 that overlies the structure of FIGS. 10B and 10C. Referring to FIG. 11D, a cross sectional view is shown taken along lines 11D-11D of FIG. 11A.

Referring to FIG. 12A, the conductive material 1120 has been planarized such that all material above a plane generally corresponding to the top of the word lines 42 has been removed. The planarizing processes described above with respect to FIGS. 5A-5C and 8A-8C can also be used to achieve the illustrated structure. The planarization has created isolated plugs 1220 from the interconnected conductive material 1120. The conductive plugs 1220 form a conductive contact with the active areas 32 underlying the word lines 42. The conductive plugs 1220 can act as bit line contacts (see bit line contacts 62 in FIG. 1B above) or cell contacts (see cell contacts 64 in FIG. 1B above), depending on their position with respect to and underlying active area 32. By removing the sacrificial material 220 to form the deep voids 1020, the plugs 1220 can be easily formed by simply coating the structure and planarizing, as shown. Furthermore, the conductive plugs 1220 are self-aligned in that the deep voids 1020 allow the conductive material 1120 to fill in and form the plugs 1220 that are directly aligned with the underlying active areas 32 without a mask step. The conductive plugs 1220 can be structurally identical to the conductive plugs 820 of FIG. 8.

Referring to FIGS. 12B-12D, the cross sectional views show how the plane of planarization corresponds to the top of the word lines 42. The illustrated planarization can be achieved using an etch step with a mechanical component, such as chemical mechanical polishing. Other processes that can be used to planarize include dry etching. As illustrated by FIG. 12D, the plugs 1220 generally overlie the active areas 32. The two plugs 1220 illustrated in FIG. 8D can function as cell contacts because they overlie the end regions of the active areas 32. In FIG. 12D, as in FIG. 8D, the side wall of the wordline 42 that would otherwise be visible in such a cross-sectional view has been omitted to more clearly illustrate the lack of structure between the plugs 1220.

Referring to FIG. 13, the schematic, cross-sectional view illustrates an embodiment of an electronic device with which the structure of FIGS. 12A-12C can be used. In particular, a first capacitor 1320 overlies two of the word lines 42 at the left of the figure, and a second capacitor 1330 overlies two of the word lines 42 at the right of the figure. Each capacitor has a top electrode 1324 and a bottom electrode 1328. The top electrode 1324 can be a continuous common layer for an entire array, with periodic holes formed to allow the passage of structures such as the bit line contact 1340, for example. In between the electrodes 1324 and 1328 is a capacitor dielectric material 1326. In between the two capacitors 1320 and 1330, a bit line plug 1340 forms an electrical contact between a conductive plug 1220 and an overlying bit line 52. A source region 1360 of the active area 32 is located below a conductive plug 1220 in the central region of the active area 32. On either side of the active area 1360 are channel regions 1380. The tips of the active area 32 have drain regions 1370, such that the channel regions 1380 can provide a connection between the source region 1360 and the drain regions 1370.

In operation, electrical current can travel along the bit line 52, down the bit line plug 1340, and into the source region 1360. Then, if the appropriate voltage is applied to the first conductive portions 240 of the word lines 42 and the appropriate charge carriers populate the channel regions 1380, current can flow from the source region 1360 to the drain regions 1370. The word lines 42 can act as "gates" because the field generated by the first conductive portions 240 attracts electrical carriers to the gate dielectric 230 and allows current to flow through the channel regions 1380. When the gate is "open," allowing current to flow through the channel region 1380, an inversion layer of charge carriers (either holes or electrons) is formed in the channel region 1380. After flowing across the channel regions 1380, the current can then flow through the two side conductive plugs 1220 and across the intermediate contacts 1390 to the two bottom electrodes 1328 for storage. The intermediate contacts can be formed from a conductive material (e.g., polysilicon or metal). The described current flow can also happen in reverse to drain the stored charge from the capacitors 1320 and 1330. In this configuration, the outermost word lines 42 can be inactive.

Figure 14:
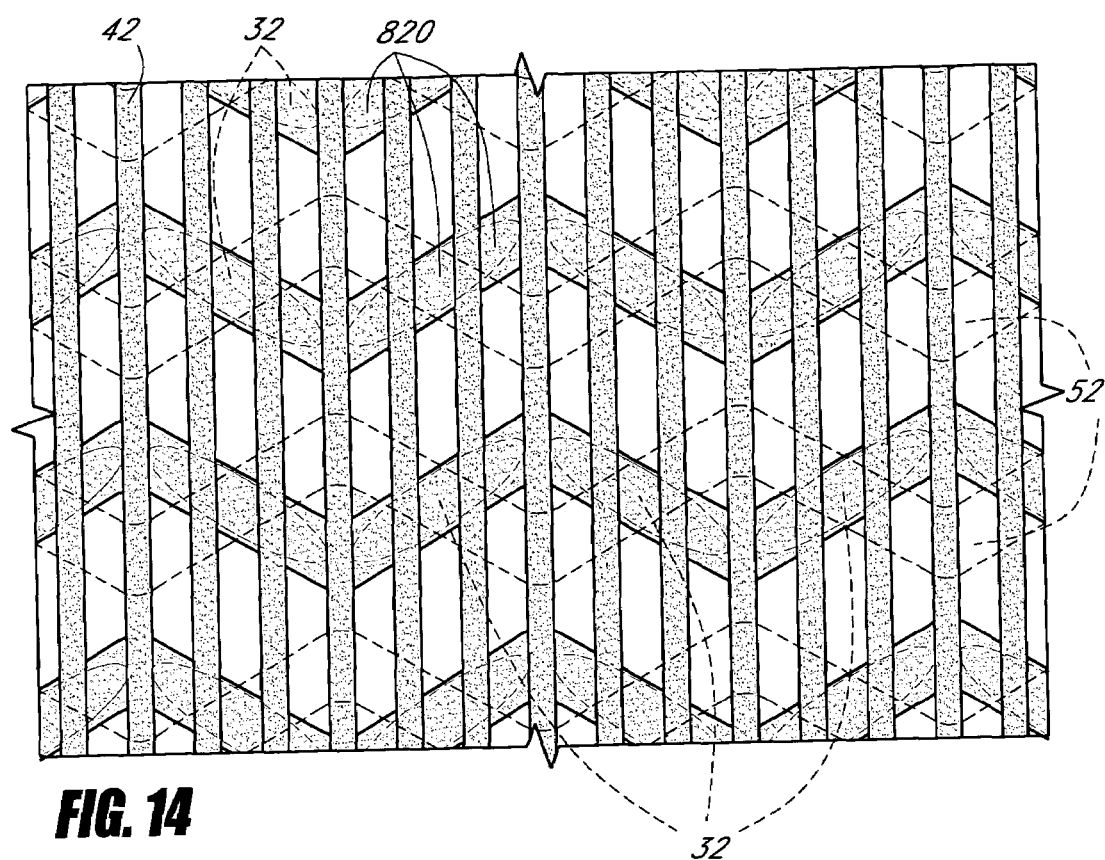
FIG. 14 shows a schematic plan view of a portion of an integrated circuit incorporating the structure illustrated in FIGS. 8 and 12, and also shows (in phantom) where curved bit lines can later be positioned to overlie that structure.

Referring to FIG. 14, the schematic plan view illustrates a layout for a portion of an integrated circuit similar to the layout of FIG. 1B. However, FIG. 14 includes exemplary plugs 820 such as those illustrated in FIGS. 8A and 12A (1220). The plugs 820 are illustrated along with the underlying active areas 32 and the overlying bit lines 52 to show how the plugs 820 can help connect the source regions 1360 of the active areas 32 to the overlying bit lines 52.

As shown in FIG. 14, the plugs 820 can be grouped according to whether they have top and bottom (in the plan view of FIG. 14) borders that slope upwardly or downwardly. In particular, the memory device can comprise a first component grouping that has a first elongate active area defining a first axis. The first axis can slope upwardly to the right, for example, in the illustrated plan view. The first elongate active area can have a first source and first and second drains. The drains can be located toward the tips of the oval-shaped active area, while the source can be located toward the center of the active area. The first component grouping can further comprise two substantially parallel word lines that cross and overlie the first active area, and at least a portion of a first word line can be located between the first drain and the first source. The first component grouping can further comprise a first plurality of contact plugs located on the same vertical level as the word lines. The contact plugs can comprise parallelogram (or rhomboid) portions of conductive material. The plurality of contact plugs can generally contact and overlie the first active area. At least one of the first plurality of contact plugs can extend between the at least two word lines and at least one of the first plurality of contact plugs can extend outwardly to the right and left from either wordline. The first plurality of contact plugs is preferably aligned with the first axis, as illustrated.

A second component grouping can be described similarly to the first component grouping, but with an axis that slopes downwardly to the right. Several groupings that meet the descriptions of first and second component groupings are illustrated in FIG. 14. Furthermore, the slopes of the first and second axes can have the same magnitude but opposite direction, as illustrated. (See FIG. 1A for an illustration of exemplary elongate axes of active areas).

The structure, principles and advantages discussed herein are applicable to a variety of contexts in which sacrificial plugs are formed in connection with features of an Accordingly, it will be appreciated by those skilled in the art that various other omissions, additions and modifications may be made to the methods and structures described above without departing from the scope of the invention. All such modifications and changes are intended to fall within the scope of the inventions, as defined by the appended claims.

We claim:

1. A method of forming an integrated circuit having multiple levels, the method comprising:
   providing active areas;
   providing a plurality of word lines above the active areas;
   coating the word lines with a sacrificial material;
   patterning the sacrificial material in a first pattern having continuous lines and removing intervening portions of the sacrificial material that are not part of the first pattern;
   coating the patterned sacrificial material with an insulating material;
   planarizing the insulating material down to a first plane to expose portions of the sacrificial material;
   removing the exposed portions of the sacrificial material to leave voids;
   depositing a conductive material into the voids; and
   planarizing the conductive material to leave isolated plugs within the voids.

2. The method of claim 1, wherein the first plane generally corresponds to a top of the word lines, and the portions of the sacrificial material exposed by planarization are pillars.

3. The method of claim 1, wherein the continuous lines are wavy.

4. The method of claim 3, further comprising patterning the continuous wavy lines such that the wavy lines intersect the word lines at a first angle between 10 and 80 degrees.

5. The method of claim 4, wherein the pillars have a non-rectangular parallelogram footprint with an interior angle corresponding to the first angle.

6. The method of claim 1, wherein the first plane overlies a top of the word lines.

7. The method of claim 6, wherein the continuous lines of sacrificial material intersect the word lines at a first angle between 10 and 80 degrees.

8. The method of claim 1, wherein the sacrificial material is photoresist.

9. The method of claim 1, wherein the sacrificial material is conformal amorphous carbon.

10. The method of claim 9, wherein patterning the sacrificial material in a first pattern includes a dry develop etch.

11. The method of claim 1, wherein the insulating material is spin-on dielectric.

12. The method of claim 1, wherein planarizing the insulating material comprises chemical mechanical polishing.

13. The method of claim 1, wherein planarizing the conductive material comprises chemical mechanical polishing.

14. The method of claim 13, wherein planarizing the conductive material comprises removing the conductive material down to a plane corresponding to a top of insulating cap portions of the word lines.

15. The method of claim 1, further comprising densifying the insulating material.

16. The method of claim 15, wherein the insulating material is densified before planarizing the insulating material down to the first plane.

17. The method of claim 15, wherein the insulating material is densified after removing the exposed portions of the sacrificial material.

18. A method of forming conductive plugs for a computer memory array comprising:
   patterning a sacrificial material in continuous lines that cross word lines;
   filling spaces between the sacrificial material and word lines with insulating material;
   removing the sacrificial material to form plug voids, the plug voids being separated by word lines in one dimension and separated by the insulating material in another dimension; and
   filling the plug voids with conductive material to form conductive plugs.

19. The method of claim 18, wherein the continuous lines form a zig-zag pattern.

20. The method of claim 18, further comprising blanket deposition of the sacrificial material over the word lines.

21. The method of claim 19, further comprising planarizing the sacrificial material down to the level of the word lines prior to patterning.

22. A method of manufacturing a portion of a memory device comprising:
   providing a substrate;
   defining an elongate active area within the substrate, the axis of elongation of the active area defining a first axis;
   defining at least one pair of word lines that define a second axis, the second axis crossing the first axis at an angle in a range of approximately 10 to approximately 80 degrees;
   filling a space between the word lines and over the active area with a sacrificial material;
   removing the sacrificial material and replacing it with a conductive material to form a conductive contact, the conductive material having two sides that are parallel to the first axis and two sides that are parallel to the second axis.

23. The method of claim 22, wherein the conductive contact is formed with sharp corners.

24. The method of claim 22, wherein the parallelogram footprint has at least two interior angles of between approximately 20 and approximately 30 degrees.

25. The method of claim 22, wherein the parallelogram footprint has at least two interior angles of between approximately 40 and approximately 50 degrees.

26. A method of forming conductive plugs between transistor gates comprising:
   patterning a sacrificial material in continuous zig-zag (in plan view) lines, the zig-zag lines having thinner (in cross-section) bridge portions that cross the transistor gates and thicker fill portions that fill the space between the gates;

removing at least the thicker fill portions to form voids with side walls formed from insulating material; and filling the voids with conductive material to form conductive plugs.

27. The method of claim 26, wherein the side walls meet at non-perpendicular corners.

28. The method of claim 26, wherein at least two side walls meet at an angle of between 10 degrees and 80 degrees.

29. The method of claim 27, wherein the voids form non-rectangular parallelograms.

* * * * *